(12) United States Patent
Hirose et al.

(10) Patent No.: US 8,815,751 B2
(45) Date of Patent: Aug. 26, 2014

(54) METHOD OF MANUFACTURING SEMICONDUCTOR DEVICE, METHOD OF PROCESSING SUBSTRATE, SUBSTRATE PROCESSING APPARATUS AND NON-TRANSITORY COMPUTER-READABLE RECORDING MEDIUM

(71) Applicants: Hitachi Kokusai Electric Inc., Tokyo (JP); L'Air Liquide-Societe Anonyme pour l'Etude et l'Exploitation des Procedes George, Paris (FR)

(72) Inventors: Yoshiro Hirose, Toyama (JP); Atsushi Sano, Toyama (JP); Kazutaka Yanagita, Tsukuba (JP); Katsuko Higashino, Newark, DE (US)

(73) Assignees: Hitachi Kokusai Electric Inc., Tokyo (JP); L'Air Liquide-Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 13/708,348

(22) Filed: Dec. 7, 2012

(65) Prior Publication Data

US 2013/0149872 A1    Jun. 13, 2013

(30) Foreign Application Priority Data

Dec. 9, 2011   (JP) .................................. 2011-270725
Oct. 23, 2012  (JP) .................................. 2012-233852

(51) Int. Cl.
    *H01L 21/31*     (2006.01)
    *H01L 21/02*     (2006.01)
    *H01L 21/318*    (2006.01)

(52) U.S. Cl.
    CPC ...... *H01L 21/3185* (2013.01); *H01L 21/02211* (2013.01); *H01L 21/02183* (2013.01); *H01L 21/02167* (2013.01); *H01L 21/0228* (2013.01); *H01L 21/02189* (2013.01); *H01L 21/02186* (2013.01); *H01L 21/02181* (2013.01); *H01L 21/02178* (2013.01); *H01L 21/02175* (2013.01)

USPC  438/762; 438/784; 427/255.29; 427/255.393; 427/255.394

(58) Field of Classification Search
    CPC ................ H01L 21/28158; H01L 21/28194; H01L 21/28202; C23C 16/401; C23C 16/45525; C23C 16/45527
    USPC .............. 438/762, 784; 427/569; 257/E21.27
    See application file for complete search history.

(56) References Cited

U.S. PATENT DOCUMENTS

| | | | |
|---|---|---|---|
| 7,638,170 B2 | 12/2009 | Li | |
| 2004/0180557 A1 | 9/2004 | Park et al. | |
| 2011/0244142 A1* | 10/2011 | Cheng et al. | 427/569 |
| 2012/0115334 A1* | 5/2012 | Takaba | 438/784 |

FOREIGN PATENT DOCUMENTS

| | | |
|---|---|---|
| JP | A-2006-024668 | 1/2006 |
| JP | A-2009-283587 | 12/2009 |

(Continued)

OTHER PUBLICATIONS

Nov. 14, 2013 Korean Office Action issued in Korean Application No. 10-2012-0136643 (with English-language translation).

*Primary Examiner* — Reema Patel
*Assistant Examiner* — Syed Gheyas
(74) *Attorney, Agent, or Firm* — Oliff PLC

(57) ABSTRACT

There is provided a method of manufacturing a semiconductor device, including: forming a film containing a specific element, nitrogen, and carbon on a substrate, by alternately performing the following steps a specific number of times: a step of supplying a source gas containing the specific element and a halogen element, to the substrate; and a step of supplying a reactive gas composed of three elements of carbon, nitrogen, and hydrogen and having more number of a carbon atom than the number of a nitrogen atom in a composition formula thereof, to the substrate.

22 Claims, 6 Drawing Sheets

(56) References Cited

FOREIGN PATENT DOCUMENTS

| KR | 10-2004-0077462 | 9/2004 |
| KR | 10-2011-0017404 | 2/2011 |
| WO | WO 2009/149167 A2 | 12/2009 |
| WO | WO 2011/123792 A2 | 10/2011 |

* cited by examiner

METHOD OF MANUFACTURING SEMICONDUCTOR DEVICE, METHOD OF PROCESSING SUBSTRATE, SUBSTRATE PROCESSING APPARATUS AND NON-TRANSITORY COMPUTER-READABLE RECORDING MEDIUM

TECHNICAL FIELD

The present invention relates to a method of manufacturing a semiconductor device including a step of forming a thin film on a substrate, a method of processing a substrate, a substrate processing apparatus and a non-transitory computer-readable recording medium.

DESCRIPTION OF RELATED ART

Manufacturing steps of a semiconductor device include a step of forming a silicon-based insulating film such as a silicon oxide film (a $SiO_2$ film, simply called a SiO film hereafter) and a silicon nitride film (a $Si_3N_4$ film, simply called a SiN film hereafter), etc., namely include a step of forming an insulating film containing silicon as a specific element, on a substrate such as a silicon wafer. The silicon oxide film has excellent insulation properties and low dielectric properties, and is widely used as the insulating film and an inter-layer film. The silicon nitride film has excellent insulation properties, corrosion resistance, dielectric properties, and film stress controllability, etc., and is widely used as the insulating film and a mask film, a charge storage film, and a stress control film. It is publicly-known that when carbon (C) is contained in these insulating films, etching resistance of the insulating films can be improved.

As a technique of forming a silicon carbonitride film (SiCN film) containing carbon in the silicon nitride film, namely, forming a film containing silicon as the specific element, carbon, and nitrogen (simply called a carbonitride film hereafter), there is disclosed a technique of alternately supplying three kinds of gases of a gas containing silicon (Si), a gas containing carbon (C), and a gas containing nitrogen (N), to a substrate. However, control of the three kinds of gases is complicated, and when the above-mentioned technique is used, productivity during film formation is reduced in some cases. In addition, when the above-mentioned technique is used, it is not easy to obtain a high concentration of 25 at % or more for example, regarding a carbon concentration in the silicon carbonitride film.

Accordingly, an object of the present invention is to provide the method of manufacturing a semiconductor device, the method of processing a substrate, the substrate processing apparatus and the non-transitory computer-readable recording medium, capable of improving productivity during film formation of a carbonitride film, and increasing a carbon concentration in the carbonitride film.

SUMMARY OF THE INVENTION

According to an aspect of the present invention, there is provided a method of manufacturing a semiconductor device, including:
forming a film containing a specific element, nitrogen, and carbon on a substrate, by alternately performing the following steps a specific number of times:
supplying a source gas containing the specific element and a halogen element to the substrate; and
supplying a reactive gas composed of three elements of carbon, nitrogen, and hydrogen and having more number of a carbon atom than the number of a nitrogen atom in a composition formula thereof, to the substrate.

According to other aspect of the present invention, there is provided a method of processing a substrate, including:
forming a film containing a specific element, nitrogen, and carbon on a substrate, by alternately performing the following steps a specific number of times:
supplying a source gas containing the specific element and a halogen element to the substrate; and
supplying a reactive gas composed of three elements of carbon, nitrogen, and hydrogen and having more number of a carbon atom than the number of a nitrogen atom in a composition formula thereof, to the substrate.

According to further other aspect of the present invention, there is provided a substrate processing apparatus, including:
a processing chamber in which a substrate is housed;
a source gas supply system configured to supply a source gas containing a specific element and a halogen element into the processing chamber;
a reactive gas supply system configured to supply a reactive gas composed of three elements of carbon, nitrogen, and hydrogen and having more number of a carbon atom than the number of a nitrogen atom in a composition formula thereof, into the processing chamber; and
a control part configured to control the source gas supply system and the reactive gas supply system, so that a processing of forming a film containing the specific element, nitrogen, and carbon on the substrate, is performed by alternately performing a specific number of times, a processing of supplying the source gas to the substrate in the processing chamber, and a processing of supplying the reactive gas to the substrate in the processing chamber.

According to further other aspect of the present invention, there is provided a non-transitory computer-readable recording medium storing a program that causes a computer to perform a procedure of forming a film containing a specific element, nitrogen, and carbon on a substrate in a processing chamber of a substrate processing apparatus, by alternately performing the following procedures a specific number of times by a computer;
a procedure of supplying a source gas containing the specific element and a halogen element to the substrate in the processing chamber; and
a procedure of supplying a reactive gas composed of three elements of carbon, nitrogen, and hydrogen and having more number of a carbon atom than the number of a nitrogen atom in a composition formula thereof, to the substrate in the processing chamber.

According to the present invention, there is provided a method of manufacturing a semiconductor device, a method of processing a substrate, a substrate processing apparatus and a non-transitory computer-readable recording medium, capable of improving productivity during film formation of a carbonitride film, and increasing a carbon concentration in the carbonitride film.

DETAILED DESCRIPTION OF THE PREFERRED EMBODIMENT

An Embodiment of the Present Invention

Figure 1:
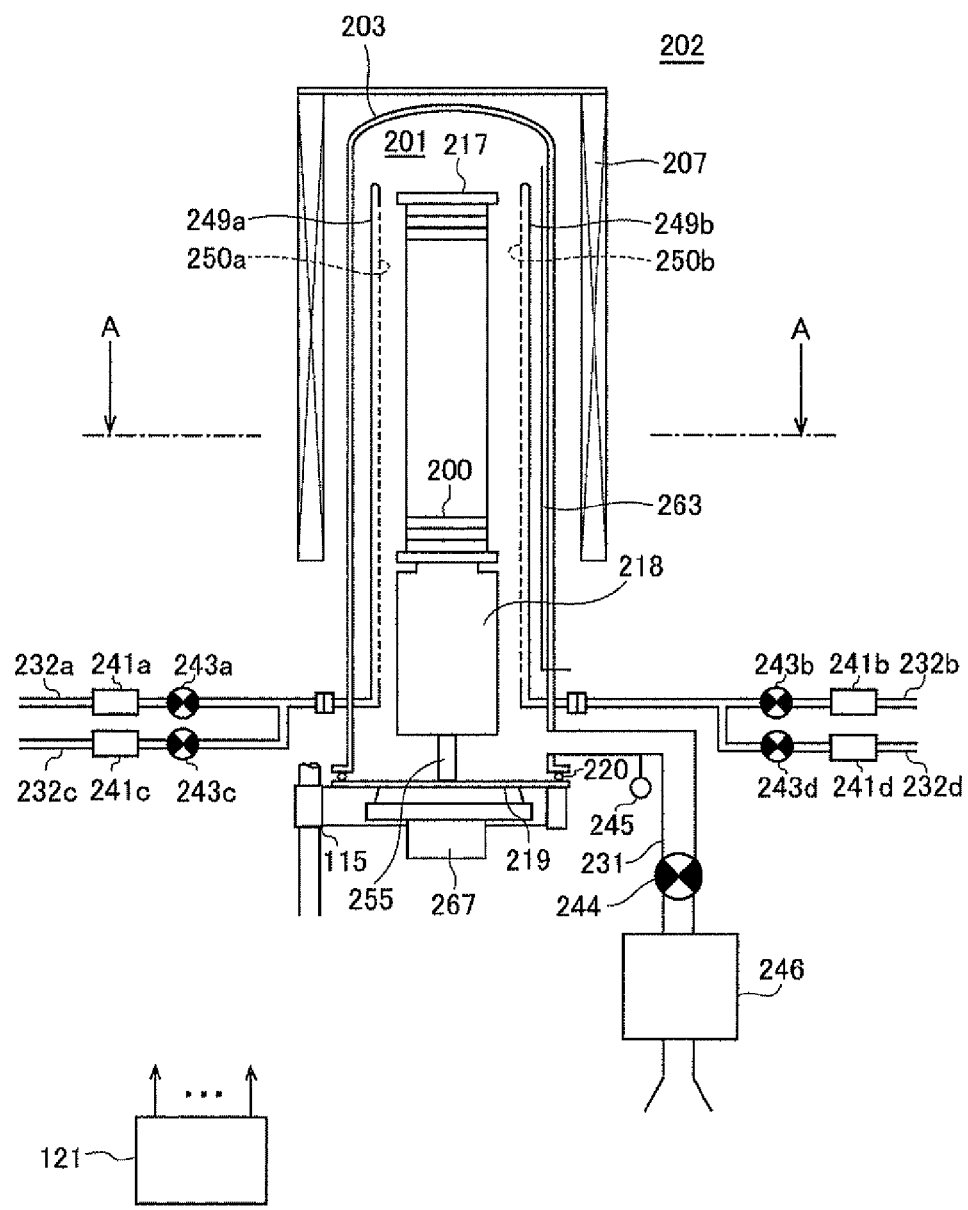
FIG. 1 is a schematic block diagram of a vertical processing furnace of a substrate processing apparatus suitably used in an embodiment of the present invention, and a view showing a processing furnace portion in a vertical cross-sectional view.
Figure 2:
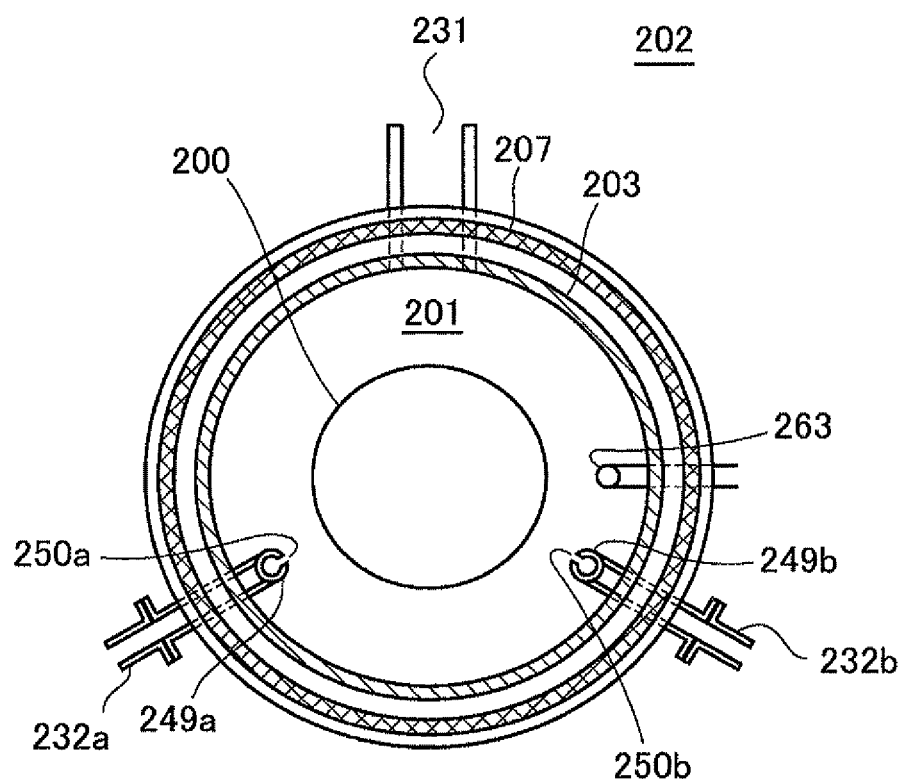
FIG. 2 is a schematic block diagram of the vertical processing furnace of the substrate processing apparatus suitably used in an embodiment of the present invention, and is a view showing the processing furnace portion taken along the line A-A of FIG. 1.

A preferred embodiment of the present invention will be described hereafter, based on the drawings.
(1) Structure of a Substrate Processing Apparatus FIG. 1 is a schematic block diagram of a vertical processing furnace of a substrate processing apparatus suitably used in this embodiment, and shows a processing furnace 202 portion in a vertical cross-sectional view. FIG. 2 is a schematic block diagram of the vertical processing furnace suitably used in this embodiment, and shows the processing furnace 202 portion taken along the line A-A of FIG. 1.

As shown in FIG. 1, the processing furnace 202 has a heater 207 as a heating unit (heating mechanism). The heater 207 has a cylindrical shape, and is vertically installed on a heater base (not shown) as a retaining plate, in such a manner as being supported thereby. Note that as will be described later, the heater 207 also functions as an activation mechanism (excitation part) for thermally activating (exciting) a gas.

A reaction tube 203 that forms a reaction vessel (processing vessel) concentrically with the heater 207, is disposed inside of the heater 207. The reaction tube 203 is made of a heat-resistant material such as quartz, etc., ($SiO_2$) or silicon carbide (SiC), and is formed into a cylindrical shape with an upper end closed and a lower end opened. A processing chamber 201 is formed in a cylinder hollow part of the reaction tube 203, and is configured to house wafers 200 as substrates in a horizontal posture in a state of being vertically arranged in multiple stages by a boat 217 as will be described later.

A first nozzle 249a and a second nozzle 249b are provided in the processing chamber 201, so as to pass through a lower part of the reaction tube 203. A first gas supply tube 232a and a second gas supply tube 232b are connected to the first nozzle 249a and the second nozzle 249b respectively. Thus, two nozzles 249a, 249b, and two gas supply tubes 232a, 232b are provided in the reaction tube 203, so that a plurality of kinds of gases, two kinds of gases here, can be supplied into the processing chamber 201.

A metal manifold for supporting the reaction tube 203 may be provided in the lower part of the reaction tube 203, and each nozzle may be provided so as to pass through a side wall of the metal manifold. In this case, the metal manifold may further include an exhaust tube 231 as will be described later. In this case as well, the exhaust tube 231 may be provided not in the metal manifold, but in the lower part of the reaction tube 203. Thus, a furnace throat part of the processing furnace may be made of metal, and the nozzle, etc., may be attached to such a metal furnace throat part.

A mass flow controller (MFC) 241a, being a flow rate controller (a flow rate control part), and a valve 243a being an open/close valve, are provided on the first gas supply tube 232a sequentially from an upstream direction. Further, a first inert gas supply tube 232c is connected to a downstream side of the valve 243a of the first gas supply tube 232a. A mass flow controller 241c being the flow rate controller (the flow rate control part) and a valve 243c being the open/close valve are provided on the first inert gas supply tube 232c sequentially from the upstream direction. Further, the above-mentioned first nozzle 249a is connected to a tip end portion of the first gas supply tube 232a. The first nozzle 249a is provided in an arc-shaped space between an inner wall of the reaction tube 203 and the wafers 200, so as to rise upward in a stacking direction of the wafers 200, extending from a lower part to an upper part of the inner wall of the reaction tube 203. Namely, the first nozzle 249a is provided in a region horizontally surrounding a wafer arrangement region, at a side of the wafer arrangement region in which the wafers 200 are arranged, so as to extend along the wafer arrangement region. The first nozzle 249a is formed as an L-shaped long nozzle, wherein its horizontal portion is provided so as to pass through a lower side wall of the reaction tube 203, and its vertical portion is provided so as to rise at least from one end side toward the other end side of the wafer arrangement region. Gas supply holes 250a for supplying a gas are formed on a side face of the first nozzle 249a. The gas supply holes 250a are opened to face a center of the reaction tube 203, so that the gas can be supplied to the wafer 200. A plurality of gas supply holes 250a are provided extending from the lower part to the upper part of the reaction tube 203, each of them having the same opening area at the same opening pitch.

A first gas supply system is mainly constituted of the first gas supply tube 232a, the mass flow controller 241a, and the valve 243a. Probably, the first nozzle 249a may be included in the first gas supply system. Further, a first inert gas supply system is mainly constituted of the first inert gas supply tube 232c, the mass flow controller 241c, and the valve 243c. The first inert gas supply system also functions as a purge gas supply system.

A mass flow controller (MFC) 241b being the flow rate controller (flow rate control part), and a valve 243b being the open/close valve, are provided on the second gas supply tube 232b sequentially from the upstream direction. Further, a second inert gas supply tube 232d is connected to a downstream side of the valve 243b of the second gas supply tube 232b. A mass flow controller 241d being the flow rate controller (flow rate control part), and a valve 243d being the open/close valve, are provided on the second inert gas supply tube 232d sequentially from the upstream direction. Further, the above-mentioned second nozzle 249b is connected to a tip end portion of the second gas supply tube 232b. The second nozzle 249b is provided in the arc-shaped space between the inner wall of the reaction tube 203 and the wafers 200, so as to rise upward in the stacking direction of the wafers 200, extending from the lower part to the upper part of the inner wall of the reaction tube 203. Namely, the second nozzle 249b is provided in the region horizontally surrounding the wafer arrangement region, at the side of the wafer arrangement region in which the wafers 200 are arranged, so as to extend along the wafer arrangement region. The second nozzle 249b is formed as the L-shaped long nozzle, wherein its horizontal portion is provided so as to pass through the lower side wall of the reaction tube 203, and its vertical portion is provided so as to rise at least from one end side toward the other end side of the wafer arrangement region. Gas supply holes 250b for supplying a gas are provided on the side face of the second nozzle 249b. The gas supply holes 250b are opened to face the center of the reaction tube 203, so that the gas can be supplied to the wafers 200. A plurality of gas supply holes 250b are provided extending from the lower part to the upper part of the reaction tube 203, each of them having the same opening area at the same opening pitch.

A second gas supply system is mainly constituted of the second gas supply tube 232b, the mass flow controller 241b, and the valve 243b. Probably, the second nozzle 249b may be included in the second gas supply system. Further, a second inert gas supply system is mainly constituted of the second inert gas supply tube 232d, the mass flow controller 241d, and the valve 243d. The second inert gas supply system also functions as the purge gas supply system.

Thus, the method of supplying a gas according to this embodiment includes: carrying a gas through nozzles 249a, 249b disposed in the arc-shaped vertically long space which is defined by the inner wall of the reaction tube 203 and edges of a plurality of stacked wafers 200; and jetting the gas into the reaction tube 203 for the first time in the vicinity of the wafers 200 from the gas supply holes 250a, 250b opened respectively on the nozzles 249a, 249b, wherein the gas flows through the reaction tube 203 mainly in a direction parallel to surfaces of the wafers 200, namely in a horizontal direction. With this structure, the following effect can be obtained. Namely, the gas can be uniformly supplied to each wafer 200, and a film thickness of a thin film formed on each wafer 200 can be equalized. The gas that flows through the surface of each wafer 200, namely a remained gas after reaction, flows toward an exhaust part, namely, flows toward the exhaust tube 231 as will be described later. However, a flowing direction of such a remained gas is suitably specified by a position of an exhaust port, and is not limited to a vertical direction.

For example, a chlorosilane-based source gas being a source gas containing at least silicon (Si) and chlorine (Cl), is supplied into the processing chamber 201 from the first gas supply tube 232a through the mass flow controller 241a, the valve 243a, and the first nozzle 249a, as the source gas containing a specific element and a halogen element. Here, the chlorosilane-based source gas is a chlorosilane-based source in a gas state, for example, a gas obtained by vaporizing the chlorosilane-based source in a liquid state under normal temperature and normal pressure, or a chlorosilane-based source in a gas state under normal temperature and normal pressure. Further, the chlorosilane-based source is a silane-based source having a chloro-group as a halogen-group, and is a source containing at least silicon (Si) and chlorine (Cl). Namely, it can be said that the chlorosilane-based source called here is a kind of a halide. The term of "a source" used in this specification indicates a meaning of "a liquid source in a liquid state", a meaning of "a source gas in a gas state", or indicates above-mentioned both meanings. Accordingly, in this embodiment, the term of the "chlorosilane-based source" indicates a meaning of "a chlorosilane-based source in a liquid state", a meaning of "a chlorosilane-based source gas in a gas state", or indicates the above-mentioned both meanings. For example, a hexa-chloro-disilane ($Si_2Cl_6$, abbreviated as HCDS) gas in which the number of ligands containing the halogen-group (Cl) in its composition formula (in one molecule) is six, can be used as the chlorosilane-based source gas. When using the liquid source in a liquid state under normal temperature and normal pressure like HCDS, the liquid source is vaporized by a vaporization system such as a vaporizer or a bubbler, etc., and is supplied as the source gas (HCDS gas).

For example, a gas including amine, namely an amine-based gas is supplied into the processing chamber 201 from the second gas supply tube 232b through the mass flow controller 241b, the valve 243b, and the second nozzle 249b, as a reactive gas containing carbon (C) and nitrogen (N). Here, the amine-based gas is amine in a gas state, that is, a gas containing an amine-group, for example, such as a gas obtained by vaporizing amine in a liquid state under normal temperature and normal pressure, or amine in a gas state under normal temperature and normal pressure. The amine-based gas includes amines such as ethyl amine, methyl amine, propyl amine, isopropyl amine, butyl amine, and isobutyl amine, etc. Here, amine is a general term of a compound in which a hydrogen atom of ammonia ($NH_3$) is substituted with a hydrocarbon-group such as an alkyl-group, etc. Namely, amine contains the hydrocarbon-group such as the alkyl-group, etc., as ligands containing the carbon atom. The amine-based gas contains three elements of carbon (C), nitrogen (N), and hydrogen (H), and the amine-based gas does not contain silicon (Si), and therefore can be called a silicon-uncontaining gas (silicon-free gas). Also, the amine-based gas contains neither silicon nor metal, and therefore can be called a silicon-uncontaining and metal-uncontaining gas (silicon-free and metal-free gas). Further, the amine-based gas can also be called a nitrogen-containing gas, a carbon-containing gas, or a hydrogen-containing gas. It can also be said that the amine-based gas is composed of only three elements of carbon (C), nitrogen (N), and hydrogen (H). In addition, the term of "amine" used in this embodiment indicates a meaning of "amine in a liquid state", a meaning of "an amine-based gas in a gas state", or indicates the above-mentioned both meanings. For example, a triethyl amine (($C_2H_5)_3N$, abbreviated as TEA) gas can be used as the amine-based gas, TEA has three ligands (ethyl-groups) containing a carbon atom in its composition formula (in one molecule), and has more number of the carbon atom than the number of a nitrogen atom in its composition formula. When using the amine in a liquid state under normal temperature and normal pressure like TEA, the amine in a liquid state is vaporized by the vaporization system such as the vaporizer or the bubbler, etc., and is supplied as the reactive gas (TEA gas).

For example a nitrogen ($N_2$) gas is supplied into the processing chamber 201 from the inert gas supply tubes 232c, 232d as the inert gas, through mass flow controllers 241c, 241d, valves 243c, 243d, gas supply tubes 232a, 232b, and nozzles 249a, 249b respectively.

When the above-mentioned gases flow from each gas supply tube for example, the source gas supply system for supplying the source gas containing the specific element and the halogen-group, namely the chlorosilane-based source gas supply system is constituted by the first gas supply system. The chlorosilane-based source gas supply system is also simply called a chlorosilane-based source supply system. Further, a reactive gas supply system, namely, an amine-based gas supply system is constituted by the second gas supply system. The amine-based gas supply system is simply called an amine supply system.

The exhaust tube 231 for exhausting an atmosphere in the processing chamber 201, is provided in the reaction tube 203. As shown in FIG. 2, in a horizontal cross-sectional view, the exhaust tube 231 is provided on a side opposed to a side where the gas supply holes 250a of the first nozzle 249a of the reaction tube 203 and the gas supply holes 250b of the second nozzle 249b of the reaction tube 203 are provided, namely, on an opposite side to the gas supply holes 250a, 250b with the wafers 200 interposed between them. Further, as shown in FIG. 1, in a vertical cross-sectional view, the exhaust tube 231 is provided below a place where the gas supply holes 250*a*, 250*b* are provided. With this structure, the gas supplied from the gas supply holes 250*a*, 250*b* to the vicinity of the wafer 200 in the processing chamber 201, flows in a horizontal direction, namely in a direction parallel to the surfaces of the wafers 200, and thereafter flows to the lower part, and is exhausted through the exhaust tube 231. As described above, the gas flows through the processing chamber 201 mainly in the horizontal direction.

A vacuum pump 246 as a vacuum exhaust device, is connected to the exhaust tube 231, interposing a pressure sensor 245 as a pressure detector (pressure detection part) for detecting a pressure in the processing chamber 201, and an APC (Auto Pressure Controller) valve 244 as a pressure controller (pressure control part). The APC valve 244 is a valve capable of performing vacuum-exhaust and stop of vacuum-exhaust of an inside of the processing chamber 201 by opening and closing the valve while operating the vacuum pump 246, and further is a valve configured to adjust the pressure in the processing chamber 201 by adjusting a degree of valve opening while operating the vacuum pump 246. An exhaust system is mainly constituted of the exhaust tube 231, the APC valve 244, and the pressure sensor 245. Probably, the vacuum pump 246 may be included in the exhaust system. The exhaust system is configured to vacuum-exhaust the inside of the processing chamber 201 so that the pressure becomes a specific pressure (degree of vacuum) by adjusting the degree of valve opening of the APC valve 244 based on information regarding pressure detected by the pressure sensor 245.

A seal cap 219 is provided in the lower part of the reaction tube 203 as a furnace throat lid member capable of air-tightly closing a lower end opening of the reaction tube 203. The seal cap 219 is configured to abut on the lower end of the reaction tube 203 from a vertically lower side. The seal cap 219 is made of a metal such as stainless for example, and is formed into a disc-shape. An O-ring 220 being a seal member is provided on an upper surface of the seal cap 219 so as to abut on the lower end of the reaction tube 203. A rotation mechanism 267 for rotating a boat 217 being a substrate retainer as will be described later, is installed on an opposite side to the processing chamber 201 with the seal cap 219 interposed between them. A rotation axis 255 of the rotation mechanism 267 is passed through the seal cap 219 and is connected to the boat 217. The rotation mechanism 267 is configured to rotate the wafer 200 by rotating the boat 217. The seal cap 219 is configured to be vertically elevated and descended by a boat elevator 115 being an elevation mechanism vertically installed outside of the reaction tube 203. The boat elevator 115 is configured to load and unload the boat 217 into/from the processing chamber 201 by elevating and descending the seal cap 219. Namely, the boat elevator 115 is configured as a carrier (carrying mechanism) for carrying the boat 217, namely, the wafer 200, into/from the processing chamber 201.

The boat 217 as a substrate support is made of a heat-resistant material such as quartz or silicon carbide, etc., and is configured to support a plurality of wafers 200 in a state of being arranged in a horizontal posture in multiple stages, with centers thereof aligned with each other. A heat insulation member 218 made of the heat-resistant material such as quartz or silicon carbide, etc., is provided in a lower part of the boat 217, so that a heat from the heater 207 is hardly transmitted toward the seal cap 219. It is also acceptable that the heat insulation member 218 is constituted of a plurality of heat insulation boards made of the heat insulation material such as quartz or silicon, etc., and an insulation board holder for supporting these heat insulation boards in a horizontal posture in multiple stages.

A temperature sensor 263 being a temperature detector, is installed inside of the reaction tube 203, so that a temperature inside of the processing chamber 201 shows a desired temperature distribution, by adjusting a power supply condition to the heater 207 based on the information regarding temperature detected by the temperature sensor 263. The temperature sensor 263 is formed into the L-shape similarly to the nozzles 249*a*, 249*b*, and is provided along the inner wall of the reaction tube 203.

Figure 3:
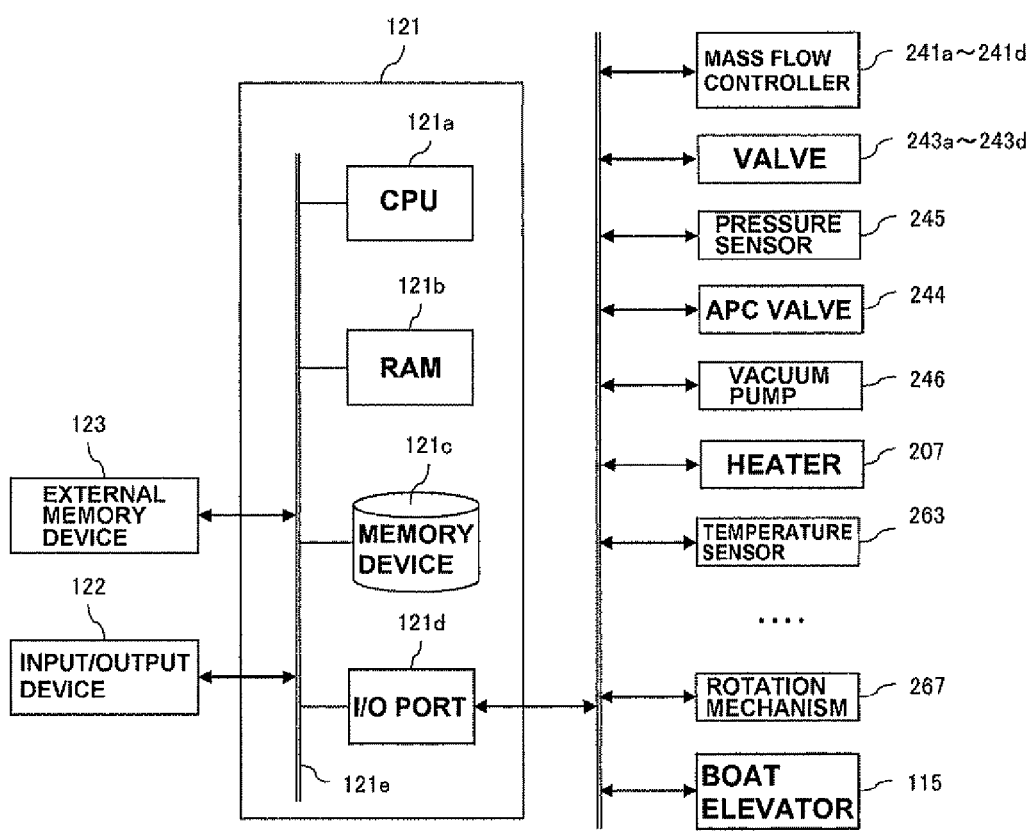
FIG. 3 is a schematic block diagram of a controller of the substrate processing apparatus suitably used in an embodiment of the present invention.

As shown in FIG. 3, the controller 121 being a control part (control unit), is configured as a computer including a CPU (Central Processing Unit) 121*a*, a RAM (Random Access Memory) 121*b*, a memory device 121*c*, and an I/O port 121*d*. The RAM 121*b*, the memory device 121*c*, and the I/O port 121*d* are configured to exchange data with the CPU 121*a* via an internal bus 121*e*. An input/output device 122 is configured as a touch panel, etc., for example, and is connected to the controller 121.

The memory device 121*c* is constituted of a flash memory or a HDD (Hard Disk Drive), etc., for example. The memory device 121*c* readably stores therein a control program for controlling an operation of a substrate processing apparatus, and a process recipe, etc., in which procedures and conditions are described for processing a substrate as will be described later. The process recipe is a set or sets of instructions to the controller 121 which are combined so as to produce a specific result, and functions as a program. The process recipe and a control program are generally called simply a program. In this specification, the term of the "program" indicates a case of including only a process recipe alone, and a case of including a control program alone, or indicates the above-mentioned both cases. Further, the RAM 121*b* is configured as a memory area (work area), in which the program and data, etc., read by the CPU 121 are temporarily retained.

The I/O port 121*d* is connected to the above-mentioned mass flow controllers 241*a*, 241*b*, 241*c*, 241*d*, valves 243*a*, 243*b*, 243*c*, 243*d*, pressure sensor 245, APC valve 244, vacuum pump 246, heater 207, temperature sensor 263, rotation mechanism 267, and boat elevator 115, etc.

The CPU 121*a* is configured to read and execute the control program from the memory device 121*c*, and read the process recipe from the memory device 121*c* according to an input, etc., of an operation command from the input/output device 122. Then, the CPU 121*a* is configured to control a flow rate control operation of each kind of gas by mass flow controllers 241*a*, 241*b*, 241*c*, 241*d*, an open/close operation by valves 243*a*, 243*b*, 243*c*, 243*d*, the open/close operation by the APC valve 244, and a pressure control operation by the APC valve 244 based on the pressure sensor 245, a temperature control operation by the heater 207 based on the temperature sensor 263, start and stop of the vacuum pump 246, a rotation and a rotation speed control operation of the boat 217 by the rotation mechanism 267, and an elevating/descending operation of the boat 217 by the boat elevator 115, and so forth.

Note that the controller 121 is not limited to a case that it is configured as an exclusive computer, and may be configured as a general-purpose computer. For example, an external memory device 123 (for example, a magnetic tape, a magnetic disc such as a flexible disc or a hard disc, an optical disc such as CD or DVD, a magneto-optic disc such as MO, a semiconductor memory such as a USB memory or a memory card) is prepared, in which the above-mentioned program is stored, and by using such an external memory device 123, the program is installed on the general-purpose computer constituting the controller 121 of this embodiment. Means for supplying the program to the computer, is not limited to a case of supplying the program through the external memory device 123. For example, it is also acceptable to supply the program using a communication means such as Internet or dedicated communication lines, not through the external memory device 123. The memory device 121c and the external memory device 123 are configured as a non-transitory computer-readable recording medium. They are generally simply called a recording medium. The term of the "recording medium" in this specification indicates a case of including the memory device 121c alone, and a case of including the external memory device 123 alone, or indicates the above-mentioned both cases.

(2) Substrate Processing Steps

Next, explanation is given for an example of forming a carbonitride film on a substrate, as a step of the manufacturing steps of a semiconductor device, using the processing furnace of the above-mentioned substrate processing apparatus. In the explanation given hereafter, an operation of each part constituting the substrate processing apparatus is controlled by the controller 121.

In this embodiment, a thin film containing a specific element, nitrogen, and carbon, namely, the carbonitride film containing the specific element, is formed on the wafer 200 by alternately performing the following steps a specific number of times:

supplying a source gas containing the specific element and a halogen element to the wafer 200 in the processing chamber 201; and supplying a reactive gas composed of three elements of carbon, nitrogen, and hydrogen and having more number of a carbon atom than the number of a nitrogen atom in a composition formula thereof (in one molecule), to the wafer 200 in the processing chamber 201.

In this embodiment, supply conditions are controlled to supply a plurality of kinds of gases containing a plurality of elements constituting the thin film to be formed, so that a composition ratio of the thin film becomes a stoichiometric composition, or becomes a specific composition ratio different from the stoichiometric composition. For example, the supply conditions are controlled, so that at least one element out of a plurality of elements constituting the thin film to be formed, becomes more excessive to the stoichiometric composition than at least other one element. Explanation is given hereafter for an example of performing film formation while controlling the ratio of a plurality of elements constituting the thin film to be formed, namely, controlling the composition ratio of the thin film.

Figure 4:
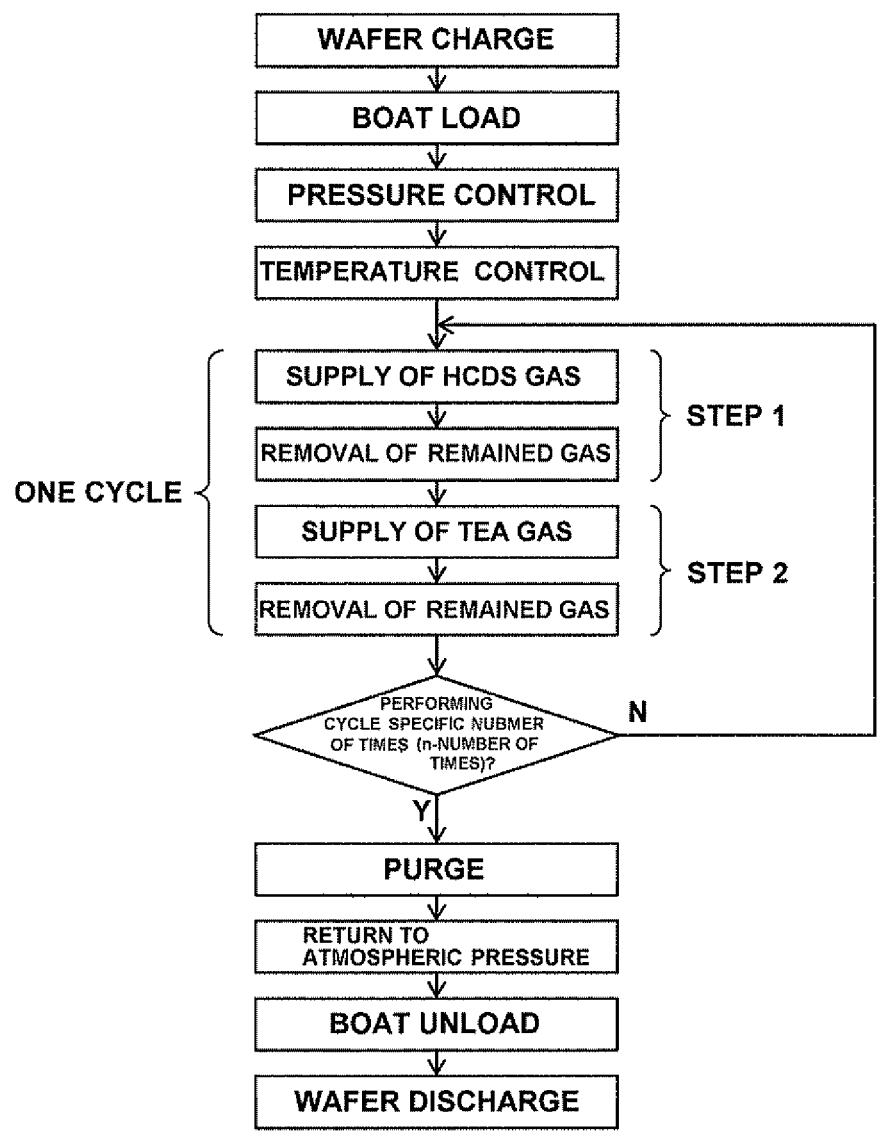
FIG. 4 is a view showing a film formation flow according to an embodiment of the present invention.
Figure 5:
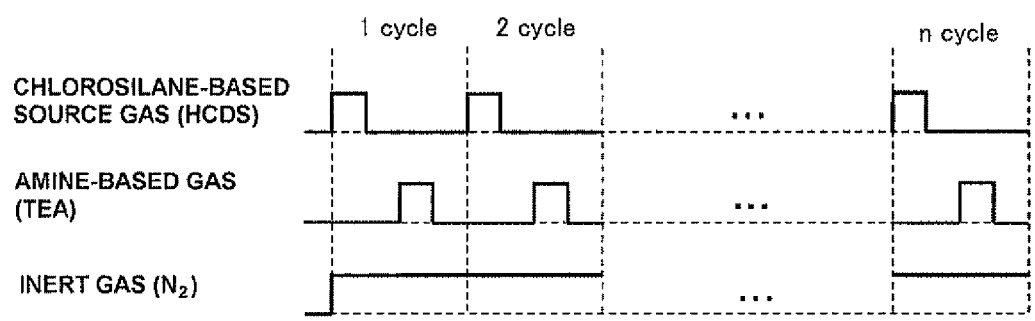
FIG. 5 is a view showing a timing of supplying gases in a film formation sequence according to an embodiment of the present invention.

A film formation (deposition) sequence of this embodiment is more specifically described using FIG. 4 and FIG. 5. FIG. 4 is a view showing a film formation flow according to this embodiment. FIG. 5 is a view showing a timing of supplying gases in the film formation sequence according to this embodiment.

Here, explanation is given for an example of forming a silicon carbonitride film (SiCN film) being a silicon-based insulation film on the wafer 200, by alternately performing the following steps a specific number of times:

supplying a HCDS gas being a chlorosilane-based source gas, to the wafer 200 in the processing chamber 201 as the source gas, and forming a first layer containing a specific element (silicon) and a halogen element (chlorine) on the wafer 200; and supplying a TEA gas being an amine-based gas having a plurality of (three) ligands (ethyl-groups) containing a carbon atom in its composition formula as the reactive gas composed of three elements of carbon, nitrogen, and hydrogen and having more number of a carbon atom than the number of a nitrogen atom in its composition formula (in one molecule), to the wafer 200 in the processing chamber 201, and inducing a reaction between the TEA gas and the first layer, and forming a second layer containing nitrogen and carbon.

The term of "a wafer" in this specification indicates a meaning of "a wafer itself" and a meaning of "a laminated body (assembly) of the wafer and a specific layer or a film, etc., formed on the surface of the wafer" (namely, the specific layer and the film formed on the surface are collectively called wafers). Further, the term of "the surface of the wafer" in this specification indicates a meaning of "the surface (exposed surface) of the wafer itself" and a meaning of "the surface of the specific layer or the film formed on the wafer, namely, an uppermost surface of the wafer as the laminated body".

Accordingly, a description that "a specific gas is supplied to the wafer" indicates a case that "a specific gas is directly supplied to the surface (exposed surface) of the wafer itself", and a case that "a specific gas is supplied to the layer or the film, etc., formed on the wafer, namely, is supplied to the uppermost surface of the wafer as the laminated body". Further, a description that "a specific layer (or a film) is formed on the wafer" indicates a case that "a specific layer (or a film) is directly formed on the surface (exposed surface) of the wafer itself", and a case that "a specific layer (or a film) is formed on the layer or the film, etc., formed on the wafer, namely, is formed on the uppermost surface of the wafer as the laminated body".

Also, the term of "a substrate" in this specification means the same meaning as "a wafer", and the "wafer" can be substituted with the "substrate" in the above-mentioned explanation.

(Wafer Charge and Boat Load)

When a plurality of wafers 200 are charged into the boat 217 (wafer charge), as shown in FIG. 1, the boat 217 supporting the plurality of wafers 200 is lifted by the boat elevator 115, and is loaded into the processing chamber 201 (boat load). In this state, the lower end of the reaction tube 203 is set in a sealed state by a seal cap 219 through the O-ring 220.

(Pressure Control and Temperature Control)

The inside of the processing chamber 201 is vacuum-exhausted by the vacuum pump 246 so as to be a desired pressure (degree of vacuum). At this time, the pressure in the processing chamber 201 is measured by the pressure sensor 245, and based on such measured information regarding pressure, the APC valve 244 is feedback-controlled (pressure control). The vacuum pump 246 maintains an operation state regularly, at least until the processing to the wafer 200 is ended. Further, the inside of the processing chamber 201 is heated by the heater 207 so as to be a desired temperature. At this time, in order to obtain a desired temperature distribution in the processing chamber 201, the power supply condition to the heater 207 is feedback-controlled based on the information regarding temperature detected by the temperature sensor 263 (temperature control). Heating of the inside of the processing chamber 201 by the heater 207 is continuously performed at least until the processing to the wafer 200 is ended. Subsequently, the rotation of the boat 217 and the wafer 200 is started by the rotation mechanism 267. The rotation of the boat 217 and the wafer 200 by the rotation mechanism 267 is continuously performed at least until the processing to the wafer 200 is completed.

(Silicon Carbonitride Film Formation Step)

Thereafter, the following steps 1, 2 are sequentially executed.

[Step 1]
(Supply of HCDS Gas)

The valve 243a of the first gas supply tube 232a is opened, to flow the HCDS gas into the first gas supply tube 232a. The flow rate of the HCDS gas that flows into the first gas supply tube 232a is controlled by the mass flow controller 241a. The HCDS gas with the flow rate controlled, is supplied into the processing chamber 201 from the gas supply holes 250a of the first nozzle 249a, and is exhausted through the exhaust tube 231. At this time, the HCDS gas is supplied to the wafer 200, and the valve 243c is simultaneously opened, to flow a $N_2$ gas as an inert gas into the first inert gas supply tube 232c. The flow rate of the $N_2$ gas that flows into the first inert gas supply tube 232c is controlled by the mass flow controller 241c. The $N_2$ gas with the flow rate controlled, is supplied into the processing chamber 201 together with the HCDS gas, and is exhausted through the exhaust tube 231.

At this time, in order to prevent an invasion of the HCDS gas into the second nozzle 249b, the valve 243d is opened, to flow the $N_2$ gas into the second inert gas supply tube 232d. The $N_2$ gas is supplied into the processing chamber 201 through the second gas supply tube 232b and the second nozzle 249b, and is exhausted through the exhaust tube 231.

At this time, the APC valve 244 is properly controlled, so that the pressure in the processing chamber 201 is set within a range of 1 to 13300 Pa, and more preferably within a range of 20 to 1330 Pa. A supply flow rate of the HCDS gas is controlled by the mass flow controller 241a and is set within a range of 1 to 1000 sccm for example. The supply flow rate of the $N_2$ gas is controlled by the mass flow controllers 241c, 241d and is set within a range of 100 to 10000 sccm respectively for example. The time for supplying the HCDS gas to the wafer 200, namely, a gas supply time (irradiation time) is set within a range of 1 to 120 seconds, and more preferably set within a range of 1 to 60 seconds for example. At this time, the temperature of the heater 207 is set so that the temperature of the wafer 200 is within a range of 250 to 700° C., and more preferably within a range of 300 to 650° C., and further more preferably within a range of 350 to 600° C. When the temperature of the wafer 200 is less than 250° C., HCDS is hardly chemically adsorbed on the wafer 200, thus hardly obtaining a practical deposition rate in some cases. Such a subject can be solved by setting the temperature of the wafer 200 to 250° C. or more. By setting the temperature of the wafer 200 to 300° C. or more and further 350° C. or more, HCDS can be further sufficiently adsorbed on the wafer 200, thus obtaining a further sufficient deposition rate. Further, when the temperature of the wafer 200 exceeds 700° C., a CVD reaction becomes dominant (a vapor phase reaction becomes dominant), to thereby easily deteriorate a uniformity in the film thickness, thus complicating the control of the film thickness. By setting the temperature of the wafer 200 to 700° C. or less, the deterioration of the uniformity in the film thickness can be suppressed, thus facilitating the control of the film thickness. Particularly, by setting the temperature of the wafer 200 to 650° C. or less, and further 600° C. or less, a surface reaction becomes dominant, and the uniformity in the film thickness can be easily secured, thus facilitating the control of the film thickness. Therefore, the temperature of the wafer 200 is preferably set within a range of 250 to 700° C., preferably within range of 300 to 650° C., and more preferably within a range of 350 to 600° C.

By supplying the HCDS gas to the wafer 200 under the above-mentioned conditions, a silicon-containing layer containing chlorine (Cl) having a thickness of less than one atomic layer to about several atomic layers, is formed on the wafer 200 (a base film on the surface), as a first layer containing the specific element (silicon) and the halogen element (chlorine). The silicon-containing layer containing Cl may be an adsorption layer of the HCDS gas, or may be a silicon layer (Si layer) containing Cl, or may include both of them.

Here, the silicon layer containing Cl is a general term of a layer including a continuous layer made of silicon (Si) and containing Cl, and also including a discontinuous layer made of Si and containing Cl, and a silicon thin film containing Cl in which the above-mentioned layers are laminated on each other. Note that the continuous layer made of Si and containing Cl is also called the silicon thin film containing Cl in some cases. Si constituting the silicon layer containing Cl includes Si in which a bond of Si— and Cl is not completely cut, and/or Si in which the bond of Si— and Cl is completely cut.

Further, the adsorption layer of the HCDS gas includes a continuous chemical adsorption layer made of gas molecules of the HCDS gas, and also includes a discontinuous chemical adsorption layer made of gas molecules of the HCDS gas. Namely, the adsorption layer of the HCDS gas includes the chemical adsorption layer made of HCDS molecules and having a thickness of one molecular layer or less than one molecular layer. HCDS ($Si_2Cl_6$) molecules that constitute the adsorption layer of the HCDS gas, include a molecule ($Si_xCl_y$ molecule) in which the bond of Si and Cl is partially cut. Namely, the adsorption layer of HCDS includes the continuous chemical adsorption layer made of $Si_2Cl_6$ molecules and/or $Si_xCl_y$ molecules, and also includes the discontinuous chemical adsorption layer made of $Si_2Cl_6$ molecules and/or $Si_xCl_y$ molecules.

The layer having a thickness of less than one atomic layer means an atomic layer formed discontinuously, and the layer having a thickness of one atomic layer means an atomic layer formed continuously. Also, the layer having a thickness of less than one molecular layer means a molecular layer formed discontinuously, and the layer having a thickness of one molecular layer means a molecular layer formed continuously.

Under a condition of allowing an autolysis (thermolysis) of the HCDS gas to occur, namely, under a condition of generating a thermal decomposition reaction of HCDS, Si is deposited on the wafer 200, to thereby form the silicon layer containing Cl. Under a condition of not allowing the autolysis (thermolysis) of the HCDS gas to occur, namely, under a condition of not generating the thermal decomposition reaction of HCDS, the HCDS gas is adsorbed on the wafer 200, to thereby form the adsorption layer of the HCDS gas. It is more preferable that the silicon layer containing Cl is formed on the wafer 200, than forming the adsorption layer of the HCDS gas on the wafer 200, because the deposition rate can be increased.

When the thickness of the silicon-containing layer containing Cl formed on the wafer 200, exceeds several atomic layers, an action of modifying layers in step 2 as will be described later, cannot reach all over the silicon-containing layer containing Cl. Further, a minimum value of the thickness of the silicon-containing layer containing Cl that can be formed on the wafer 200, is less than one atomic layer. Therefore, the thickness of the silicon-containing layer containing Cl is preferably set in a range of less than one atomic layer to about several atomic layers. By setting the thickness of the silicon-containing layer containing Cl to one atomic layer or less, an action of a modifying layers in step 2 as will be described later, can be relatively increased, and the time required for such a modifying reaction in step 2 can be shortened. Also, the time required for forming the silicon-containing layer containing Cl in step 1 can be shortened. As a result, a processing time per one cycle can be shortened, and therefore the processing time in total can be shortened. Namely, the deposition rate can also be increased. Further, by setting the thickness of the silicon-containing layer containing Cl to one atomic layer or less, the controllability of the uniformity in the film thickness can be improved.

(Removal of the Remained Gas)

After the silicon-containing layer containing Cl is formed as the first layer, the valve 243a of the first gas supply tube 232a is closed, to stop the supply of the HCDS gas. At this time, the inside of the processing chamber 201 is vacuum-exhausted by the vacuum pump 246 while opening the APC valve 244 of the exhaust tube 231, so that the HCDS gas unreacted and remained in the processing chamber 201 or after contributing to the formation of the first layer, is removed from the processing chamber 201. At this time, the supply of the $N_2$ gas as the inert gas into the processing chamber 201 is continued while maintaining the open state of the valves 243c, 243d. The $N_2$ gas functions as a purge gas, and therefore an effect of removing the HCDS gas unreacted and remained in the processing chamber 201 or after contributing to the formation of the first layer from the processing chamber 201, can be increased.

At this time, the gas remained in the processing chamber 201 may not be completely removed, or the inside of the processing chamber 201 may not be completely purged. An adverse influence is not generated in step 2 performed thereafter, provided that only a very small quantity of the gas is remained in the processing chamber 201. At this time, the flow rate of the $N_2$ gas supplied into the processing chamber 201 is not necessarily a large flow rate. For example, purge of not generating the adverse influence in step 2 can be performed by supplying the same quantity of gas as the volume of the reaction tube 203 (the processing chamber 201). Thus, by not completely purging the inside of the processing chamber 201, the purge time can be shortened, and a throughput can be improved. Further, consumption of the $N_2$ gas can be suppressed to a minimum requirement.

Inorganic source gases such as a tetrachloro-silane gas, namely a silicon tetra chloride ($SiCl_4$, abbreviated as STC) gas, a trichloro-silane ($SiHCl_3$, abbreviated as TCS) gas, a dichloro-silane ($SiH_2Cl_2$, abbreviated as DCS) gas, or a monochloro-silane ($SiH_3Cl$, abbreviated as MCS) gas, etc., may be used as the chlorosilane-based source gas, other than a hexachloro-disilane ($Si_2Cl_6$, abbreviated as HCDS) gas. Rare gases such as Ar gas, He gas, Ne gas, or Xe gas, etc., may be used as the inert gas, other than the $N_2$ gas.

[Step 2]
(Supply of TEA Gas)

After step 1 is ended and the remained gas in the processing chamber 201 is removed, the valve 243b of the second gas supply tube 232b is opened, to flow a TEA gas into the second gas supply tube 232b. The flow rate of the TEA gas that flows through the second gas supply tube 232b is controlled by the mass flow controller 241b. The TEA gas with the flow rate controlled, is supplied into the processing chamber 201 through the gas supply holes 250b of the second nozzle 249b. The TEA gas supplied into the processing chamber 201 is thermally activated (excited), and is exhausted through the exhaust tube 231. At this time, the thermally activated TEA gas is supplied to the wafer 200, and the valve 243d is simultaneously opened, to flow the $N_2$ gas as the inert gas into the second inert gas supply tube 232d. The flow rate of the $N_2$ gas that flows into the second inert gas supply tube 232d is controlled by the mass flow controller 241d. The $N_2$ gas with the flow rate controlled, is supplied into the processing chamber 201 together with the TEA gas, and is exhausted through the exhaust tube 231.

At this time, in order to prevent the invasion of the TEA gas into the first nozzle 249a, the valve 243c is opened, to flow the $N_2$ gas into the first inert gas supply tube 232c. The $N_2$ gas is supplied into the processing chamber 201 through the first gas supply tube 232a and the first nozzle 233a, and is exhausted through the exhaust tube 231.

At this time, the APC valve 244 is properly controlled, so that the pressure in the processing chamber 201 is set within a range of 1 to 13300 Pa, and preferably within a range of 399 to 3990 Pa. By setting the pressure in the processing chamber 201 in such a relatively high pressure band, the TEA gas can be thermally activated by non-plasma. By thermally activating and supplying the TEA gas, a soft reaction can be induced, and a modification of a layer as will be described later can be softly performed. A supply flow rate of the TEA gas controlled by the mass flow controller 241b is set within a range of 100 to 2000 sccm for example. Supply flow rates of the $N_2$ gas controlled by the mass flow controllers 241d, 241c are respectively set within a range of 100 to 10000 sccm for example. At this time, a partial pressure of the TEA gas in the processing chamber 201 is set within a range of 0.01 to 12667 Pa. The time for supplying the thermally activated TEA gas to the wafer 200, namely, the gas supply time (irradiation time) is set within a range of 1 to 120 seconds, and preferably within a range of 1 to 60 seconds for example. At this time, similarly to step 1, the temperature of the heater 207 is set so that the temperature of the wafer 200 is 250 to 700° C., and preferably 300 to 650° C., and more preferably 350 to 600° C., for example.

By supplying the TEA gas to the wafer 200 under the above-mentioned conditions, a reaction can be induced between the TEA gas, and the silicon-containing layer containing Cl, as the first layer, formed on the wafer 200 in step 1. Namely, the reaction can be induced between the halogen element (Cl) contained in the silicon-containing layer containing Cl as the first layer, and ligands (ethyl-groups) contained in the TEA gas. Thus, at least a part of atoms of a Cl element contained in the first layer can be extracted (separated) from the first layer, and at least a part of an ethyl-group or ethyl-groups contained in the TEA gas can be separated from the TEA gas. Then, N of the TEA gas from which the above-mentioned ethyl-group or ethyl-groups are separated, and Si contained in the first layer, can be bonded to each other. Namely, N constituting the TEA gas from which the above-mentioned ethyl-group or ethyl-groups are separated resulting in having a dangling bond, and Si contained in the first layer, resulting in having the dangling bond or already having the dangling bond, are bonded to each other, to thereby form Si—N bond. Further, at this time, C contained in the ethyl-groups being the ligands of the TEA gas or C originated from the ethyl-groups, and Si contained in the first layer, are bonded to each other, to thereby form Si—C bond. As a result, Cl is desorbed from the first layer, and a N-component is newly introduced into the first layer. Further at this time, a C-component is also introduced into the first layer.

By supplying the TEA gas under the above-mentioned conditions, the silicon-containing layer containing Cl as the first layer, and the TEA gas can be properly reacted, so that the above-mentioned series of reactions can be induced.

By these series of reactions, Cl is desorbed from the first layer, and the N-component and the C-component are newly introduced into the first layer, so that the silicon-containing layer containing Cl as the first layer, is modified to the second layer containing silicon (Si), nitrogen (N), and carbon (C), namely, is modified to the silicon carbonitride layer (SiCN layer). The second layer is a layer having a thickness of less than one atomic layer to about several atomic layers, and containing Si, N, and C. In addition, the second layer is a layer with a relatively large ratio of the Si-component and the C-component, namely is a Si-rich and a C-rich layer.

When the layer containing Si, N, and C is formed as the second layer, chlorine (Cl) contained in the first layer, and hydrogen (H) contained in the TEA gas, constitute a gaseous substance such as a chlorine ($Cl_2$) gas, a hydrogen ($H_2$) gas, and a hydrogen chloride (HCl) gas, etc., for example in a process of the modifying reaction of the first layer induced by the TEA gas, and is discharged from the processing chamber 201 through the exhaust tube 231. Namely, impurities such as Cl, etc., in the first layer are extracted and desorbed from the first layer, and are separated from the first layer. Thus, the second layer becomes a layer having fewer impurities such as Cl, etc., than the impurities of the first layer.

(Removal of the Remained Gas)

After the second layer is formed, the valve 243b of the second gas supply tube 232b is closed, to stop the supply of the TEA gas. At this time, the inside of the processing chamber 201 is vacuum-exhausted by the vacuum pump 246 while opening the APC valve 244 of the exhaust tube 231, so that the TEA gas unreacted and remained in the processing chamber 201 or after contributing to the formation of the second layer is removed from the processing chamber 201, and a reaction byproduct is also removed from the processing chamber 201. At this time, the supply of the $N_2$ gas as the inert gas into the processing chamber 201 is continued while maintaining the open state of the valves 243d, 243c. The $N_2$ gas functions as the purge gas, and therefore the effect of removing the TEA gas unreacted and remained in the processing chamber 201 or after contributing to the formation of the second layer, and removing a reaction byproduct, from the processing chamber 201, can be increased.

At this time, the gas remained in the processing chamber 201 may not be completely removed, or the inside of the processing chamber 201 may not be completely purged. An adverse influence is not generated in step 1 performed thereafter, provided that only a very small quantity of the gas is remained in the processing chamber 201. At this time, the flow rate of the $N_2$ gas supplied into the processing chamber 201 is not necessarily a large flow rate. Purge of not generating the adverse influence in step 1 can be performed by supplying the same quantity of gas as the volume of the reaction tube 203 (the processing chamber 201) for example. Thus, by not completely purging the inside of the processing chamber 201, the purge time can be shortened, and the throughput can be improved. Further, the consumption of the $N_2$ gas can be suppressed to a minimum requirement.

An ethyl amine-based gas obtained by vaporizing diethyl amine (($C_2H_5)_2$NH, abbreviated as DEA), monoethyl amine ($C_2H_5NH_2$, abbreviated as MEA), etc., a methyl amine-based gas obtained by vaporizing trimethyl amine (($CH_3)_3$N, abbreviated as TMA), dimethyl amine (($CH_3)_2$NH, abbreviated as DMA), monomethyl amine ($CH_3$NH, abbreviated as MMA), a propyl amine-based gas obtained by vaporizing tripropyl amine (($C_3H_7)_3$N, abbreviated as TPA), dipropyl amine (($C_3H_7)_2$NH, abbreviated as DPA), monopropyl amine ($C_3H_7NH_2$, abbreviated as MPA), an isopropyl amine-based gas obtained by vaporizing triisopropyl amine ($[(CH_3)_2CH]_3$N, abbreviated as TIPA), diisopropyl amine ($[(CH_3)_2CH]_2$NH, abbreviated as DIPA), monoisopropyl amine (($CH_3)_2$CHNH$_2$, abbreviated as MIPA), a butyl amine-based gas obtained by vaporizing tributyl amine (($C_4H_9)_3$N, abbreviated as TBA), dibutyl amine (($C_4H_9)_2$NH, abbreviated as DBA), monobutyl amine ($C_4H_9NH_2$, abbreviated as MBA), etc., or an isobutyl amine-based gas obtained by vaporizing triisobutyl amine ($[(CH_3)_2CHCH_2]_3$N, abbreviated as TIBA), diisobutyl amine ($[(CH_3)_2CHCH_2]_2$NH, abbreviated as DIBA), monoisobutyl amine (($CH_3)_2CHCH_2NH_2$, abbreviated as MIBA), etc., can be preferably used as an amine-based gas, other than triethyl amine (($C_2H_5)_3$N, abbreviated as TEA). Namely, at least one kind of gas out of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, $[(CH_3)_2CHCH_2]_xNH_{3-x}$, (x is integer of 1 to 3 in the formula), can be preferably used as the amine-based gas.

The amine-based gas is composed of three elements of carbon, nitrogen, and hydrogen, and it is preferable to use a gas having more number of a carbon atom than the number of a nitrogen atom in its composition formula (in one molecule). Namely, as the amine-based gas, it is preferable to use a gas including at least one amine selected from a group consisting of TEA, DEA, MEA, TMA, DMA, TPA, DPA, MPA, TIPA, DTPA, MIPA, TBA, DBA, MBA, TIBA, DIBA, and MIBA.

When the chlorosilane-based source gas containing the specific element (silicon) and the halogen element (chlorine), such as HCDS gas, etc., is used as the source gas, the amine-based gas composed of three elements of carbon, nitrogen, and hydrogen and having more number of a carbon atom than the number of a nitrogen atom in its composition formula (in one molecule), such as the TEA gas and DEA gas, etc., is used as the reactive gas, to thereby increase the carbon concentration in the second layer formed in step 2, namely, increase the carbon concentration in the SiCN film formed in the step which is performed a specific number of times as will be described later. For example, according to a film formation sequence of this embodiment, the carbon concentration in the formed SiCN film can be a high concentration of 25 at % or more and for example 40 at % or more.

Meanwhile, when the chlorosilane-based source gas containing the specific element (silicon) and the halogen element (chlorine) such as HCDS gas, etc., is used as the source gas, the carbon concentration in the second layer, namely the carbon concentration in the SiCN film cannot be high by using the gas composed of three elements of carbon, nitrogen, and hydrogen and not having more number of a carbon atom than the number of a nitrogen atom in its composition formula (in one molecule) like an amine-based gas such as MMA gas, etc., and an organic hydrazine-based gas such as MMH gas or DMH gas, etc., as will be described later as the reactive gas, rather than a case of using the amine-based gas composed of three elements of carbon, nitrogen, and hydrogen and not having more number of the carbon atom than the number of the nitrogen atom in its composition formula as the reactive gas.

Further, a gas having a plurality of ligands containing a carbon (C) atom in its composition formula (in one molecule), namely, a gas having a plurality of hydrocarbon-groups such as alkyl-groups, etc., in its composition formula (in one molecule), is preferably used as the amine-based gas. More specifically, a gas having three or two ligands (hydrocarbon-groups such as alkyl-groups, etc.) containing the carbon (C) atom in its composition formula (in one molecule) is preferably used as the amine-based gas. For example, a gas including at least one amine selected from a group consisting of TEA, DEA, TMA, DMA, TPA, DPA, TIPA, DIPA, TBA, DBA, TIBA, and DIBA, is preferably used.

When the chlorosilane-based source gas containing the specific element (silicon) and the halogen element (chlorine), such as HCDS gas, etc., is used as the source gas, the carbon concentration in the second layer, namely, the carbon concentration in the SiCN film can be more increased, by using the amine-based gas composed of three elements of carbon, nitrogen, and hydrogen, and having a plurality of ligands containing the carbon atom in its composition formula (in one molecule), such as TEA gas and DEA gas, etc., namely, the amine-based gas having a plurality of hydrocarbon-groups such as alkyl-groups, etc., in its composition formula (in one molecule), as the reactive gas.

Meanwhile, when the chlorosilane-based source gas containing silicon and the halogen element (chlorine) such as HODS gas, etc., is used as the source gas, the carbon concentration in the second layer, namely the carbon concentration in the SiCN film cannot be high and a proper carbon concentration is hardly realized in a case of using a gas not having a plurality of ligands containing the carbon atom in its composition formula (in one molecule) like the organic hydrazine-based gas, etc., such as MMH gas, etc., as the reactive gas as will be described later, rather than a case of using the amine-based gas having a plurality of ligands containing the carbon atom in its composition formula (in one molecule) as the reactive gas.

Further, the cycle rate (thickness of the SiCN layer formed per unit cycle) can be more improved and the ratio of the nitrogen concentration with respect to the carbon concentration (the ratio of the nitrogen concentration/carbon concentration) in the second layer, namely the ratio of the nitrogen concentration with respect to the carbon concentration (the ratio of the nitrogen concentration/carbon concentration) in the SiCN film can be more increased, by using the amine-based gas having two ligands (hydrocarbon-groups such as alkyl-groups, etc.) containing the carbon atom in its composition formula (in one molecule) like DEA gas, etc., as the reactive gas, rather than a case of using the amine-based gas having three ligands (hydrocarbon-groups such as alkyl-groups, etc.) containing the carbon atom in its composition formula (in one molecule) like TEA gas, as the reactive gas.

Reversely, the ratio of the carbon concentration with respect to the nitrogen concentration (the ratio of the carbon concentration/nitrogen concentration) in the second layer, namely the ratio of the carbon concentration with respect to the nitrogen concentration (the ratio of the carbon concentration/nitrogen concentration) in the SiCN film can be more increased, by using the amine-based gas having three ligands (hydrocarbon-groups such as alkyl-groups, etc.) containing the carbon atom in its composition formula (in one molecule) like TEA gas, etc., as the reactive gas, rather than a case of using the amine-based gas having two ligands (hydrocarbon-groups such as alkyl-groups, etc.) containing the carbon atom in its composition formula (in one molecule) as the reactive gas.

Namely, the cycle rate and the nitrogen concentration and the carbon concentration in the formed SiCN film can be finely adjusted by the number of ligands (the number of hydrocarbon-groups such as alkyl-groups, etc.) containing the carbon atom contained in the reactive gas, namely, by suitably changing gas species of the reactive gas.

As described above, the carbon concentration in the SiCN film can be more increased by suitably selecting the gas species (composition) of the amine-based gas as the reactive gas. In addition, in order to obtain a further higher carbon concentration, for example, the pressure in the processing chamber 201 during supply of the amine-based gas (TEA gas) to the wafer 200, is preferably set to be larger than the pressure in the processing chamber 201 during supply of the chlorosilane-based source gas (HCDS gas) in step 1. Namely, when the pressure in the processing chamber 201 during supply of the HCDS gas to the wafer 200 is indicated by $P_1[P_a]$, and the pressure in the processing chamber 201 during supply of the TEA gas to the wafer 200 is indicated by $P_2[P_a]$, namely, pressures $P_1$, $P_2$ are preferably set to satisfy a relation of $P_2 \geq P_1$.

Reversely, in order to properly suppress an increase of the carbon concentration in the SiCN film, the pressure in the processing chamber 201 during supply of the amine-based gas (TEA gas) to the wafer 200, is preferably set to be not more than the pressure in the processing chamber 201 during supply of the chlorosilane-based source gas (HCDS gas) to the wafer 200 in step 1. Namely, the pressures $P_1$, $P_2$ are preferably set to satisfy a relation of $P_1 \geq P_2$.

Namely, the carbon concentration in the formed SiCN film can be finely adjusted by properly controlling the pressure in the processing chamber 201 during supply of the amine-based gas.

Rare gases such as Ar gas, He gas, Ne gas, or Xe gas, etc., may also be used as the inert gas, other than the $N_2$ gas.

(Performing Cycle a Specific Number of Times)

The above-mentioned steps 1, 2 are set as one cycle, and by performing this cycle once or more (a specific number of times), a film containing silicon (Si), nitrogen (N), and carbon (C) having a specific thickness and a specific composition respectively, can be formed on the wafer 200. Namely, a silicon carbonitride film (SiCN film) can be formed on the wafer 200. Note that the above-mentioned cycle is preferably repeated multiple numbers of times. Namely, it is preferable that the thickness of the SiCN layer formed per one cycle is set to be smaller than a desired film thickness, and the above-mentioned cycle is repeated multiple numbers of times until such a desired film thickness is obtained.

When the cycle is performed multiple numbers of times in each step of at least a second cycle or thereafter, the description: "a specific gas is supplied to the wafer 200" indicates a meaning that "a specific gas is supplied to a layer formed on the wafer 200, namely, the uppermost surface of the wafer 200 as the laminated body", and the description: "a specific layer is formed on the wafer 200" indicates a meaning that "a specific layer is formed on a layer formed on the wafer 200, namely, on the uppermost surface of the wafer 200 as the laminated body". This point is also described above. The same thing can be said for other embodiment as will be described later.

(Purge and Return to an Atmospheric Pressure)

When a film forming treatment is applied to the SiCN film having a specific film thickness and a specific composition, the valves 243c, 243d are opened, to supply the $N_2$ gas as the inert gas into the processing chamber 201, through the first inert gas supply tube 232c and the second inert gas supply tube 232d, respectively, and is exhausted through the exhaust tube 231. The $N_2$ gas functions as the purge gas, to thereby purge the inside of the processing chamber 201 by the inert gas, and remove the gas remained in the processing chamber 201 and also remove the reaction byproduct, from the processing chamber 201 (purge). Thereafter, the atmosphere in the processing chamber 201 is replaced with the inert gas (inert gas replacement), and the pressure in the processing chamber 201 is returned to a normal pressure (return to the atmospheric pressure).

(Boat Unload and Wafer Discharge)

Thereafter, the seal cap 219 is descended by the boat elevator 115, and the lower end of the reaction tube 203 is opened, and the processed wafers 200 are unloaded to the outside of the reaction tube 203 from the lower end of the reaction tube 203 in a state of being supported by the boat 217. Then, the processed wafers 200 are discharged from the boat 217 (wafer discharge).

(3) Effects of this Embodiment

According to this embodiment, one or a plurality of effects can be exhibited as described below.

(a) According to this embodiment, the SiCN film can be formed on the wafer 200 by alternately performing: supplying the HCDS gas to the wafer 200 in the processing chamber 201, and supplying the TEA gas to the wafer 200 in the processing chamber 201, a specific number of times. Thus, productivity in a case of forming the SiCN film can be improved. Namely, in a film formation sequence of a related art, when the SiCN film is formed, there is a necessity for alternately supplying at least three kinds of gases of the gas containing silicon (Si), the gas containing carbon (C), and the gas containing nitrogen (N), to the wafer 200. Meanwhile, in the film formation sequence of this embodiment, the SiCN film can be formed by alternately supplying two kinds of gases of the HCDS gas and the TEA gas to the wafer 200. Therefore, control of the gas supply can be simplified, and the number of the gas supply per one cycle can be reduced, and the productivity during film formation can be improved.

(b) According to this embodiment, supplying the HCDS gas to the wafer 200 in the processing chamber 201, and supplying the TEA gas to the wafer 200 in the processing chamber, are alternately performed a specific number of times. Therefore, the Si-rich and C-rich SiCN film can be formed on the wafer 200. Namely, if compared with the film formation sequence of alternately supplying three kinds of gases of the gas containing silicon, the gas containing carbon, and the gas containing nitrogen to the wafer 200, the film formation sequence of this embodiment has an advantage that silicon and carbon can be sufficiently fixed to the wafer 200 in a process of forming the SiCN film, and a desorption of these elements from the wafer 200 can be sufficiently suppressed, and as a result, the SiCN film having a high carbon concentration can be formed.

(c) According to this embodiment, the carbon concentration in the SiCN film can be increased by using the amine-based gas composed of three elements of carbon, nitrogen, and hydrogen and having more number of a carbon atom than the number of a nitrogen atom in its composition formula (in one molecule), as the reactive gas.

Particularly, the carbon concentration in the SiCN film can be increased by using the amine-based gas having a plurality of ligands containing the carbon (C) atom in its composition formula (in one molecule), namely, by using the amine-based gas having a plurality of hydrocarbon-groups such as alkyl-groups, etc., in its composition formula (in one molecule), as the reactive gas. More specifically, the carbon concentration in the SiCN film can be increased by using the TEA gas, TMA gas, TPA gas, TIPA gas, TBA gas, and TIBA gas, etc., having three ligands (hydrocarbon-groups such as alkyl-groups, etc.) containing the carbon (C) atom in its composition formula (in one molecule), or by using the DEA gas, DMA gas, DPA gas, DIPA gas, DBA gas, and DIBA gas, etc., having two ligands (hydrocarbon-groups such as alkyl-groups, etc.) containing the carbon (C) atom in its composition formula (in one molecule).

(d) According to this embodiment, the cycle rate (the thickness of the SiCN layer formed per unit cycle), and the nitrogen concentration and the carbon concentration in the SiCN film, can be finely adjusted by the number of ligands (the number of hydrocarbon-groups such as alkyl-groups, etc.) containing the carbon atom contained in the reactive gas, namely, by suitably changing the gas species of the reactive gas.

For example, the cycle rate can be more improved and the ratio of the nitrogen concentration with respect to the carbon concentration (the ratio of the nitrogen concentration/carbon concentration) in the SiCN film can be more increased, by using the amine-based gas having two ligands (hydrocarbon- groups such as alkyl-groups, etc.) containing the carbon atom in its composition formula (in one molecule) like DEA gas, etc., as the reactive gas, rather than a case of using the amine-based gas having three ligands (hydrocarbon-groups such as alkyl-groups, etc.) containing the carbon atom in its composition formula (in one molecule) like TEA gas, etc., as the reactive gas.

Meanwhile, for example, the ratio of the carbon concentration with respect to the nitrogen concentration in the SiCN film (the ratio of carbon concentration/nitrogen concentration) in the SiCN film can be more increased by using the amine-based gas having three ligands (hydrocarbon-groups such as alkyl-groups, etc.) containing the carbon atom in its composition formula (in one molecule) like TEA, etc., gas as the reactive gas, rather than a case of using the amine-based gas having two ligands (hydrocarbon-groups such as alkyl-groups, etc.) containing the carbon atom in its composition formula (in one molecule) like DEA gas, etc., as the reactive gas.

(e) According to this embodiment, the carbon concentration in the SiCN film can be finely adjusted by controlling the pressure in the processing chamber 201 during supply of the reactive gas.

For example, the carbon concentration in the SiCN film can be more increased by setting the pressure in the processing chamber 201 during supply of the TEA gas to the wafer 200 in step 2, to be larger than the pressure in the processing chamber 201 during supply of the HCDS gas to the wafer 200 in step 1.

Meanwhile, for example, the increase of the carbon concentration in the SiCN film can be properly suppressed by setting the pressure in the processing chamber 201 during supply of the TEA gas to the wafer 200 in step 2, to be not more than the pressure in the processing chamber 201 during supply of the HCDS gas to the wafer 200 in step 1.

(f) According to this embodiment, an impurity concentration in the formed SiCN film can be reduced by using the TEA gas composed of three elements of carbon, nitrogen, hydrogen, being the silicon-uncontaining and metal-uncontaining amine-based gas, as the reactive gas. Namely, if compared with a film formation sequence of using a tetrakis(ethylmethylamino)hafnium (Hf[N($C_2H_5$)($CH_3$)]$_4$, abbreviated as TEMAH) gas, etc., composed of four elements of hafnium, carbon, nitrogen, and hydrogen as the reactive gas for example, the film formation sequence of this embodiment using the TEA gas as the reactive gas, has an advantage that a mixture probability of impurity elements into the second layer formed by a reaction between the reactive gas and the first layer (a silicon-containing layer containing Cl) can be reduced, and the impurity concentration in the formed SiCN film can be reduced.

(g) According to this embodiment, reaction controllability, particularly composition controllability during formation of the SiCN film can be improved by using the TEA gas composed of three elements of carbon, nitrogen, and hydrogen, being the silicon-uncontaining and metal-uncontaining amine-based gas as the reactive gas, and by employing a film formation sequence of alternately supplying the HCDS gas and the TEA gas to the wafer 200. Namely, if compared with a film formation sequence of using the TEMAH gas, etc., composed of four elements of hafnium, carbon, nitrogen, and hydrogen for example as the reactive gas, the film formation sequence of this embodiment using the TEA gas, has an advantage that the reaction controllability, particularly the composition controllability during formation of the second layer by inducing a reaction between the reactive gas and the first layer (the silicon-containing layer containing Cl) can be improved. Further, if compared with a film formation sequence of alternately supplying three kinds of gases of the gas containing silicon, the gas containing carbon, and the gas containing nitrogen to the wafer 200, the film formation sequence of this embodiment of alternately supplying two kinds of gases of the HCDS gas and the TEA gas to the wafer 200, has an advantage that the reaction controllability, particularly the composition controllability in a process of forming the SiCN film can be improved. With these structures, the composition of the SiCN film can be easily controlled, and the carbon concentration in the SiCN film can be increased to a high concentration of 25 at % or more. As a result, an etching resistance of the formed SiCN film can be improved and a dielectric constant of the formed SiCN film can be adjusted.

(h) According to this embodiment, the uniformity in the film thickness of the SiCN film in-plane of the wafer 200 and inter-planes of the wafers 200 can be respectively improved by using the TEA gas composed of three elements of carbon, nitrogen, and hydrogen, being the silicon-uncontaining and metal-uncontaining amine-based gas as the reactive gas. Namely, if compared with the TEMAH gas composed of four elements of hafnium, carbon, nitrogen, and hydrogen, etc., for example, the TEA gas composed of three elements of carbon, nitrogen, and hydrogen, has a high reactivity with the first layer (the silicon-containing layer containing Cl). Therefore, the film formation sequence of this embodiment using the TEA gas as the reactive gas has an advantage that the reaction between the reactive gas and the first layer (the silicon-containing layer containing Cl) can be surely and uniformly induced in-plane of the wafer 200 and inter-planes of the wafers 200. As a result, the uniformity in the film thickness of the SiCN film in-plane of the wafer 200 and inter-planes of the wafers 200 can be respectively improved.

Other Embodiment of the Present Invention

As described above, the embodiment of the present invention is specifically described. However, the present invention is not limited to the above-mentioned embodiment, and can be variously modified in a range not departing from the gist of the invention.

For example, in the above-mentioned embodiment, explanation is given for a case that in order to form the second layer containing Si, N, and C, the chlorosilane-based source gas is supplied to the wafer 200 in the processing chamber 201, and thereafter the amine-based gas is supplied thereto. However, a supply order of these gases may be reversed. Namely, the amine-based gas is supplied, and thereafter the chlorosilane-based source gas may be supplied. Namely, one of the gases of the chlorosilane-based source gas and the amine-based gas is supplied, and thereafter the other gas may be supplied. Thus, a quality and a composition ratio of the formed thin film can be adjusted by changing the supply order of the gas.

Further, for example, in the above-mentioned embodiment, explanation is given for a case that the chlorosilane-based source gas is used as the source gas, when the first layer containing the specific element (silicon) and the halogen element (chlorine) is formed in step 1. However, the silane-based source gas having halogen-based ligands other than chloro-groups may also be used instead of the chlorosilane-based source gas. For example, a fluorosilane-based source gas may be used instead of the chlorosilane-based source gas. Here, the fluorosilane-based source gas is a fluorosilane-based source in a gas state, and for example is a gas obtained by vaporizing the fluorosilane-based source in a liquid state under normal temperature and normal pressure, and is a chlorosilane-based source, etc., in a gas state under normal temperature and normal pressure. Further, the fluorosilane-based source means a silane-based source having a fluoro-group as the halogen-group, and means a source containing at least silicon (Si) and fluorine (F). Namely, it can be said that the fluorosilane-based source mentioned here is a kind of a halide. A silicon fluoride gas such as tetrafluorosilane gas, namely, a silicon tetrafluoride ($SiF_4$) gas or a hexafluorodisilane ($Si_2F_6$) gas, etc., can be used as the fluorosilane-based source gas. In this case, the fluorosilane-based source gas is supplied to the wafer 200 in the processing chamber 201, when the first layer containing the specific element and the halogen element is formed. In this case, the first layer is a layer containing Si and F, namely is a silicon-containing layer containing F.

Further, for example, in the above-mentioned embodiment, explanation is given for a case that the amine-based gas is used as the reactive gas, when the silicon-containing layer containing Cl as the first layer is modified to the second layer containing Si, N, and C. However, a gas including an organic hydrazine compound, namely, an organic hydrazine-based gas for example, may be used as the reactive gas, instead of the amine-based gas. The gas including the organic hydrazine compound can be simply called an organic hydrazine compound gas or an organic hydrazine gas. Here, the organic hydrazine-based gas is organic hydrazine in a gas state, and for example is a gas obtained by vaporizing the organic hydrazine in a liquid state under normal temperature and normal pressure, and a gas containing a hydrazine-group such as organic hydrazine, etc., in a gas state under normal temperature and normal pressure. The organic hydrazine-based gas is composed of three elements of carbon (C), nitrogen (N), and hydrogen (H), being the silicon-uncontaining gas and further the silicon-uncontaining and metal-uncontaining gas. A methylhydrazine-based gas obtained by vaporizing monomethylhydrazine (($CH_3$)$HN_2H_2$, abbreviated as MMH), dimethylhydrazine (($CH_3$)$_2N_2H_2$, abbreviated as DMH), trimethylhydrazine (($CH_3$)$_2N_2(CH_3$)H, abbreviated as TMH), etc., or an ethylhydrazine-based gas obtained by vaporizing ethylhydrazine (($C_2H_5$)$HN_2H_2$, abbreviated as EH), etc., for example can be preferably used as the organic hydrazine-based gas. In this case, the organic hydrazine-based gas is supplied to the wafer 200 in the processing chamber 201 when the silicon-containing layer containing Cl as the first layer, is modified to the second layer containing Si, N, and C. Further, the gas composed of three elements of carbon, nitrogen, and hydrogen and having more number of a carbon atom than the number of a nitrogen atom in its composition formula (in one molecule) is preferably used as the organic hydrazine-based gas. Moreover, the gas having a plurality of ligands containing the carbon (C) atom in its composition formula (in one molecule), namely, the gas having a plurality of hydrocarbon-groups such as alkyl-groups, etc., in its composition formula (in one molecule) is preferably used as the organic hydrazine-based gas. More specifically, the gas having three or two ligands (hydrocarbon-groups such as alkyl-groups, etc.) containing the carbon (C) atom in its composition formula (in one molecule) is preferably used as the organic hydrazine-based gas.

Further, for example, in the above-mentioned embodiment, explanation is given for a case that in order to form the second layer containing Si, N, and C, the chlorosilane-based gas is supplied to the wafer 200 in the processing chamber 201, and thereafter the amine-based gas is supplied thereto. However, as shown in FIG. 6, it is also acceptable that the chlorosilane-based source gas and the amine-based gas are simultaneously supplied to the wafer 200 in the processing chamber 201, to thereby induce the CVD reaction.

Figure 6:
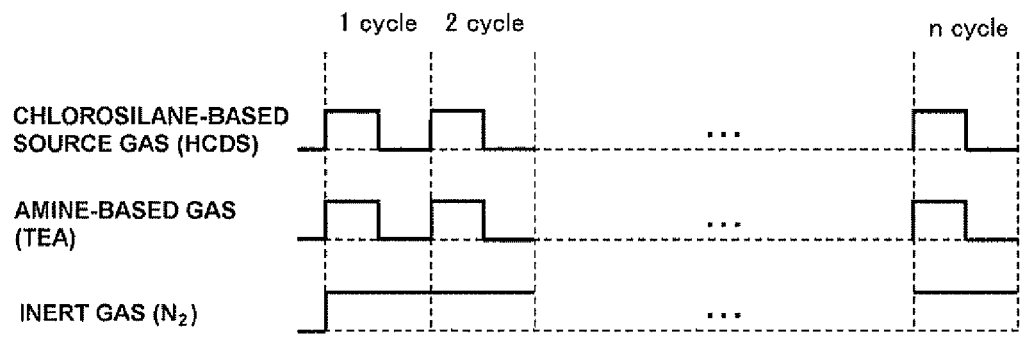
FIG. 6 is a view showing a timing of supplying gases in a film formation sequence according to other embodiment.

FIG. 6 is a view showing a timing of supplying gases in a film formation sequence according to other embodiment, in which the chlorosilane-based source gas and the amine-based gas are simultaneously supplied. In the film formation sequence shown in FIG. 6, the following steps are set as one cycle: simultaneously supplying the chlorosilane-based source gas (HODS) and the amine-based gas (TEA) composed of three elements of carbon, nitrogen, and hydrogen and having more number of the carbon atom than the number of the nitrogen atom, to the wafer 200 in the processing chamber 201, and forming a layer containing silicon, nitrogen, and carbon on the wafer 200; and purging the inside of the processing chamber 201. Then, by performing this cycle a specific number of times (n-number of times), the silicon carbonitride film (SiCN film) having a specific composition and a specific film thickness is formed. Processing conditions in this case may be similar to the processing conditions of the above-mentioned embodiment.

Thus, similar effects can be obtained as the effects of the above-mentioned embodiment even in a case that the chlorosilane-based source gas and the amine-based gas are not sequentially supplied to the wafer 200 in the processing chamber 201, but are simultaneously supplied thereto. However, as described in the above-mentioned embodiment, the chlorosilane-based source gas and the amine-based gas can be more properly reacted under a condition that a surface reaction is dominant, and the controllability of the film thickness can be improved in a case that the chlorosilane-based source gas and the amine-based gas are alternately supplied with purging the inside of the processing chamber 201 interposed between them.

By using a silicon insulating film formed based on a technique of the above-mentioned each embodiment and each modified example as a side wall spacer, a device forming technique with a small leak current and an excellent processability can be provided.

Further, by using the silicon insulating film formed based on the technique of the above-mentioned each embodiment and each modified example as an etch stopper, a device forming technique excellent in processability can be provided.

According to the above-mentioned each embodiment and each modified example, the silicon insulating film of an ideal stoichiometric composition ratio can be formed without using plasma even in a low temperature zone. Further, since the silicon insulating film can be formed without using plasma, the above-mentioned each embodiment and each modified example can also be applied to a process which is weak against a plasma damage, such as DPT and SADP processes.

Further, in the above-mentioned embodiment, explanation is given for an example of forming the silicon-based insulating film containing silicon being a semiconductor element, as the carbonitride film. However, the present invention can also be applied to a case of forming a metal-based thin film containing a metal element such as titanium (Ti), zirconium (Zr), hafnium (Hf), tantalum (Ta), aluminum (Al), or molybdenum (Mo), etc. Namely, the present invention can also be suitably applied to a case of forming a metal carbonitride film such as a titanium carbonitride film (TiCN film), a zirconium carbonitride film (ZrCN film), a hafnium carbonitride film (HfCN film), a tantalum carbonitride film (TaCN film), an aluminum carboniride film (AlCN film), or a molybdenum carbonitride film (MoCN film), etc.

In this case, the source gas containing the metal element and the halogen element is used instead of the chlorosilane-based source gas of the above-mentioned embodiment, and the film formation is performed based on a similar sequence as the sequence of the above-mentioned embodiment. Namely, the metal carbonitride film having a specific composition and a specific film thickness can be formed on the wafer 200 by alternately performing the following steps a specific number of times:

supplying the source gas containing the metal element and the halogen element to the wafer 200 in the processing chamber 201; and supplying the reactive gas composed of three elements of carbon, nitrogen, and hydrogen and having more number of a carbon atom than the number of a nitrogen atom in its composition formula, to the wafer 200 in the processing chamber 201.

For example, when the titanium carbonitride film (TiCN film) is formed as the carbonitride film, a gas containing Ti and a chloro-group such as titanium tetra chloride ($TiCl_4$), etc., and a gas containing Ti and a fluoro-group such as titanium tetrafluoride ($TiF_4$), etc., can be used as the source gas. A gas similar to the gas of the above-mentioned embodiment can be used as the reactive gas. The processing condition at this time can be similar to the processing condition of the above-mentioned embodiment for example.

Further for example, when the zirconium carbonitride film (ZrCN film) is formed as the carbonitride film, a gas containing Zr and the chloro-group such as zirconium tetra chloride ($ZrCl_4$), etc., and a gas containing Zr and the fluoro-group such as zirconium tetrafluoride ($ZrF_4$), etc., can be used as the source gas. A gas similar to the gas of the above-mentioned embodiment can be used as the reactive gas. Note that the processing condition at this time can be similar to the processing condition of the above-mentioned embodiment for example.

Further for example, when the hafnium carbonitride film (HfCN film) is formed as the carbonitride film, a gas containing Hf and the chloro-group such as hafnium tetra chloride ($HfCl_4$), etc., and a gas containing Hf and the fluoro-group such as hafnium tetrafluoride ($HfF_4$), etc., can be used as the source gas. The gas similar to the gas of the above-mentioned embodiment can be used as the reactive gas. Note that the processing condition at this time can be similar to the processing condition of the above-mentioned embodiment for example.

Further for example, when the tantalum carbonitride film (TaCN film) is formed as the carbonitride film, a gas containing Ta and the chloro-group such as tantalum pentachloride ($TaCl_5$), etc., and a gas containing Ta and the fluoro-group such as tantalum pentafluoride ($TaF_5$), etc., can be used as the source gas. The gas similar to the gas of the above-mentioned embodiment can be used as the reactive gas. Note that the processing condition at this time can be similar to the processing condition of the above-mentioned embodiment for example.

Further for example, when the aluminum carbonitride film (AlCN film) is formed as the carbonitride film, a gas containing Al and the chloro-group such as aluminum trichloride ($AlCl_3$), etc., and a gas containing Al and the fluoro-group such as aluminum trifluoride ($AlF_3$), etc., can be used as the source gas. The gas similar to the gas of the above-mentioned embodiment can be used as the reactive gas. Note that the processing condition at this time can be similar to the processing condition of the above-mentioned embodiment for example.

Further for example, when the molybdenum carbonitride film (MoCN film) is formed as the carbonitride film, a gas containing Mo and the chloro-group such as molybdenum pentachloride ($MoCl_5$), etc., and a gas containing Mo and the fluoro-group such as molybdenum pentafluoride ($MoF_5$), etc., can be used as the source gas. The gas similar to the gas of the above-mentioned embodiment can be used as the reactive gas. Note that the processing condition at this time can be similar to the processing condition of the above-mentioned embodiment for example.

Thus, the present invention can be applied to the film formation of forming not only the silicon-based thin film but also the metal-based thin film, and even in this case, an effect similar to the effect of the above-mentioned embodiment can be obtained. Namely, the present invention can be suitably applied to a case of forming the thin film containing the specific element such as a semiconductor element and a metal element, etc.

Further, in the above-mentioned embodiment, explanation is given for an example of forming the thin film using a batch-type substrate processing apparatus for processing a plurality of substrates simultaneously. However, the present invention is not limited thereto, and can be suitably applied to a case that the thin film is formed using a non-batch type substrate processing apparatus for processing one or several substrates simultaneously. Further, in the above-mentioned embodiment, explanation is given for an example of forming the thin film using the substrate processing apparatus having a hot wall type processing furnace. However, the present invention is not limited thereto, and can be suitably applied to a case that the thin film is formed using a substrate processing apparatus having a cold wall type processing furnace.

Further, the above-mentioned each embodiment and each modified example can be used in combination with each other suitably.

Further for example, the present invention can also be realized by changing a process recipe of the existing substrate processing apparatus. When the process recipe is changed, the process recipe of the present invention can be installed on the existing substrate processing apparatus via a telecommunication line and the non-transitory computer-readable recording medium in which the process recipe is recorded, or the process recipe itself can be changed to the process recipe of the present invention by operating an input/output device of the existing substrate processing apparatus.

Example

The SiCN film was formed on a plurality of wafers in the above-mentioned sequence, using the substrate processing apparatus of the above-mentioned embodiment. The HCDS gas was used as the source gas, and the TEA gas was used as the reactive gas. A wafer temperature during film formation was set to 600 to 650° C. Other processing condition was set to a specific value within a range of the processing condition of the above-mentioned embodiment. Then, the uniformity in the film thickness of the formed SiCN film in-plane of the wafer (called WTW, hereafter), the uniformity in film thickness of the formed SiCN films inter-planes of the wafers (called WTW, hereafter), a refractive index (called R.1., hereafter), a XPS composition ratio, and a wet etching rate with respect to a hydrogen fluoride (HF)-containing liquid (called WER, hereafter) having a concentration of 1.0%, were respectively measured. Measurement results thereof are shown in FIG. 7.

Figure 7:
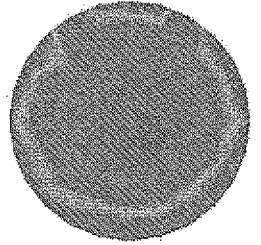
FIG. 7 is a view showing each kind of measurement result of a SiCN film according to an example of the present invention.

As shown in FIG. 7, it was confirmed that the uniformity in the film thickness of the SiCN film formed in-plane of the wafer (WIW), and the uniformity in film thickness of this SiCN film inter-planes of the wafers (WTW), were respectively 2.7% and 2.5% in this example. Note that the uniformity in the film thickness becomes high, as the numerical values of both of the WIW and WTW become smaller. Namely the uniformity in the film thickness becomes excellent, and it was confirmed that the SiCN film formed in this example was excellent in both of the uniformity in the film thickness in-plane of the wafer, and the uniformity in the film thickness inter-planes of the wafers.

Further, the refractive index (R.I) of the film formed in this example was 2.2, and it was confirmed that the formed film was the SiCN film.

Further from the XPS measurement result of the SiCN film formed in this example, it was confirmed that Si/C/N/O ratio in the SiCN film formed in this example was 40/42/15/3. Namely, it was confirmed that a C-concentration in the SiCN film was a high concentration of 42 at %. Also, it was confirmed that Si concentration was 40 at %, N-concentration was 15 at %, and O-concentration was 3 at % in the SiCN film. O-components are detected at an impurity level, and the O-components are considered to be caused by a natural oxide film formed on an interface between the SiCN film and the base film, and formed on the surface of the SiCN film.

Further, it was confirmed that the wet etching rate (WER) of the SiCN film formed in this example was 0.5 Å/rain. Namely, it was confirmed that the SiCN film having a high etching resistance was formed.

<Preferred Aspects of the Present Invention>

Preferred aspects of the present invention will be described hereafter.

(Supplementary Description 1)

According to an aspect of the present invention, there is provided a method of manufacturing a semiconductor device, including:

forming a film containing a specific element, nitrogen, and carbon on a substrate, by alternately performing the following steps a specific number of times:

supplying a source gas containing the specific element and a halogen element, to the substrate; and supplying a reactive gas composed of three elements of carbon, nitrogen, and hydrogen and having more number of a carbon atom than the number of a nitrogen atom in a composition formula thereof, to the substrate.

Here, the meaning of the description: "supplying the source gas and supplying the reactive gas, are alternately performed a specific number of times" includes following both cases:

a case that supplying one of the gases of the source gas and the reactive gas, and supplying the other gas different from the above-mentioned one of the gases of the source gas and the reactive gas, are set as one cycle, and this cycle is performed once; and a case that this cycle is performed multiple numbers of times, which means that this cycle is performed once or more (a specific number of times).

(Supplementary Description 2)

There is provided the method according to the supplementary description 1, wherein the reactive gas has a plurality of ligands containing the carbon atom in its composition formula.

(Supplementary Description 3)

There is provided the method according to the supplementary description 1 or 2, wherein the reactive gas has three ligands containing the carbon atom in its composition formula.

(Supplementary Description 4)

There is provided the method according to the supplementary description 1 or 2, wherein the reactive gas has two ligands containing the carbon atom in its composition formula.

(Supplementary Description 5)
There is provided the method according to any one of the supplementary descriptions 1 to 4, wherein the reactive gas includes at least one of amine and organic hydrazine.

(Supplementary Description 6)
There is provided the method according to any one of the supplementary descriptions 1 to 4, wherein the reactive gas includes at least one amine selected from a group consisting of ethyl amine, methyl amine, propyl amine, isopropyl amine, butyl amine, and isobutyl amine.

(Supplementary Description 7)
There is provided the method according to the supplementary description 1 or 2, wherein the reactive gas includes at least one amine selected from a group consisting of triethyl amine, diethyl amine, trimethyl amine, dimethyl amine, tripropyl amine, dipropyl amine, triisopropyl amine, diisopropyl amine, tributyl amine, dibutyl amine, triisobutyl amine, and diisobutyl amine.

(Supplementary Description 8)
There is provided the method according to the supplementary description 1 or 2, wherein the reactive gas includes at least one amine selected from a group consisting of diethyl amine, dimethyl amine, dipropyl amine, diisopropyl amine, dibutyl amine, and diisobutyl amine.

(Supplementary Description 9)
There is provided the method according to any one of the supplementary descriptions 1 to 8, wherein the reactive gas is a silicon-uncontaining gas.

(Supplementary Description 10)
There is provided the method according to any one of the supplementary descriptions 1 to 8, wherein the reactive gas is a silicon-uncontaining and metal-uncontaining gas.

(Supplementary Description 11)
There is provided the method according to any one of the supplementary descriptions 1 to 10, wherein the specific element includes silicon or metal, and the halogen element includes chlorine or fluorine.

(Supplementary Description 12)
There is provided the method according to any one of the supplementary descriptions 1 to 11, wherein in alternately performing the steps the specific number of times, a film containing the specific element, nitrogen, and carbon is formed on the substrate while removing the halogen element contained in the source gas and hydrogen contained in the reactive gas, as a gas.

(Supplementary Description 13)
There is provided the method according to any one of the supplementary descriptions 1 to 12, wherein
in supplying the source gas, a first layer containing the specific element and the halogen element is formed, and
in supplying the reactive gas, the first layer and the reactive gas are reacted with each other, to thereby form a second layer containing the specific element, nitrogen, and carbon.

(Supplementary Description 14)
There is provided the method according to the supplementary description 13, wherein in supplying the reactive gas, the first layer and the reactive gas are reacted with each other, so that at least a part of atoms of the halogen element contained in the first layer is extracted from the first layer, and at least a part of a ligand or ligands contained in the reactive gas is separated from the reactive gas.

(Supplementary Description 15)
There is provided the method according to the supplementary description 14, wherein in supplying the reactive gas, the first layer and the reactive gas are reacted with each other, so that at least a part of atoms of the halogen element contained in the first layer is extracted from the first layer, and at least a part of a ligand or ligands contained in the reactive gas is separated from the reactive gas, and nitrogen of the reactive gas from which the above-mentioned ligand or ligands are separated, and the specific element contained in the first layer are bonded to each other.

(Supplementary Description 16)
There is provided the method according to any one of the supplementary descriptions 13 to 15, wherein in supplying the reactive gas, the first layer and the reactive gas are reacted with each other, so that at least a part of atoms of the halogen element contained in the first layer is extracted from the first layer, and at least a part of a ligand or ligands contained in the reactive gas is separated from the reactive gas, and nitrogen of the reactive gas from which the above-mentioned ligand or ligands are separated, and the specific element contained in the first layer are bonded to each other, and further carbon contained in the ligand and the specific element contained in the first layer are bonded to each other.

(Supplementary Description 17)
There is provided the method according to any one of the supplementary descriptions 1 to 16, wherein forming the film containing the specific element, nitrogen, and carbon, is performed in a state that the substrate is housed in a processing chamber, and a pressure in the processing chamber in supplying the reactive gas is set to be larger than a pressure in the processing chamber in supplying the source gas.

(Supplementary Description 18)
According to other aspect of the present invention, there is provided a method of processing a substrate, including:
forming a film containing a specific element, nitrogen, and carbon, on a substrate by alternately performing the following steps a specific number of times:
supplying a source gas containing the specific element and a halogen element to the substrate; and
supplying a reactive gas composed of three elements of carbon, nitrogen, and hydrogen and having more number of a carbon atom than the number of a nitrogen atom in a composition formula thereof, to the substrate.

(Supplementary Description 19)
According to further other aspect of the present invention, there is provided a substrate processing apparatus, including:
a processing chamber in which a substrate is housed;
a source gas supply system configured to supply a source gas containing a specific element and a halogen element into the processing chamber;
a reactive gas supply system configured to supply a reactive gas composed of three elements of carbon, nitrogen, and hydrogen and having more number of a carbon atom than the number of a nitrogen atom in a composition formula thereof, into the processing chamber; and
a control part configured to control the source gas supply system and the reactive gas supply system, so that a processing of forming a film containing the specific element, nitrogen, and carbon on the substrate, is performed by alternately performing a processing of supplying the source gas to the substrate in the processing chamber, and a processing of supplying the reactive gas to the substrate in the processing chamber, a specific number of times.

(Supplementary Description 20)
According to further other aspect of the present invention, there is provided a program that causes a computer to perform a procedure of forming a film containing a specific element, nitrogen, and carbon on a substrate, by alternately performing the following procedures a specific number of times:
a procedure of supplying a source gas containing the specific element and a halogen element, to the substrate in the processing chamber; and a procedure of supplying a reactive gas composed of three elements of carbon, nitrogen and hydrogen and having more number of a carbon atom than the number of a nitrogen atom in a composition formula thereof, to the substrate in the processing chamber.

(Supplementary Description 21)

According to further other aspect of the present invention, there is provided a non-transitory computer-readable recording medium storing a program that causes a computer to perform a procedure of forming a film containing a specific element, nitrogen, and carbon on a substrate in a processing chamber of a substrate processing apparatus, by alternately performing the following procedures a specific number of times:

a procedure of supplying a source gas containing the specific element and a halogen element, to the substrate in the processing chamber; and a procedure of supplying a reactive gas composed of three elements of carbon, nitrogen and hydrogen and having more number of a carbon atom than the number of a nitrogen atom in a composition formula thereof, to the substrate in the processing chamber.

What is claimed is:

1. A method of manufacturing a semiconductor device, comprising:
   forming a film containing a specific element, nitrogen, and carbon on a substrate, by alternately performing the following steps a specific number of times:
   supplying a source gas containing the specific element and a halogen element, to the substrate in a processing chamber; and
   supplying a reactive gas composed of three elements of carbon, nitrogen, and hydrogen and having more number of a carbon atom than the number of a nitrogen atom in a composition formula thereof, to the substrate in the processing chamber,
   wherein a pressure in the processing chamber in supplying the reactive gas is set to be larger than a pressure in the processing chamber in supplying the source gas.

2. The method of claim 1, wherein the reactive gas has a plurality of ligands containing the carbon atom in the composition formula.

3. The method of claim 1, wherein the reactive gas has three ligands containing the carbon atom in the composition formula.

4. The method of claim 1, wherein the reactive gas has two ligands containing the carbon atom in the composition formula.

5. The method of claim 1, wherein the reactive gas comprises at least one of amine and organic hydrazine.

6. The method of claim 1, wherein the reactive gas comprises at least one amine selected from a group consisting of ethyl amine, methyl amine, propyl amine, isopropyl amine, butyl amine, and isobutyl amine.

7. The method of claim 1, wherein the reactive gas comprises at least one amine selected from a group consisting of triethyl amine, diethyl amine, trimethyl amine, dimethyl amine, tripropyl amine, dipropyl amine, triisopropyl amine, diisopropyl amine, tributyl amine, dibutyl amine, triisobutyl amine, and diisobutyl amine.

8. The method of claim 1, wherein the reactive gas comprises at least one amine selected from a group consisting of diethyl amine, dimethyl amine, dipropyl amine, diisopropyl amine, dibutyl amine, and diisobutyl amine.

9. The method of claim 1, wherein the reactive gas is a silicon-uncontaining gas.

10. The method of claim 1, wherein the reactive gas is a silicon-uncontaining and metal-uncontaining gas.

11. The method of claim 1, wherein the specific element comprises silicon or metal, and the halogen element comprises chlorine or fluorine.

12. The method of claim 1, wherein in alternately performing the steps the specific number of times, the film containing the specific element, nitrogen, and carbon is formed on the substrate while removing the halogen element contained in the source gas and hydrogen contained in the reactive gas, as a gas.

13. The method of claim 1, wherein in supplying the source gas, a first layer containing the specific element and the halogen element is formed, and
   in supplying the reactive gas, the first layer and the reactive gas are reacted with each other, to thereby form a second layer containing the specific element, nitrogen, and carbon.

14. The method of claim 13, wherein in supplying the reactive gas, the first layer and the reactive gas are reacted with each other, so that at least a part of atoms of the halogen element contained in the first layer is extracted from the first layer, and at least a part of a ligand or ligands contained in the reactive gas is separated from the reactive gas.

15. The method of claim 13, wherein in supplying the reactive gas, the first layer and the reactive gas are reacted with each other, so that at least a part of atoms of the halogen element contained in the first layer is extracted from the first layer, and at least a part of a ligand or ligands contained in the reactive gas is separated from the reactive gas, and nitrogen of the reactive gas from which at least the part of the ligand or ligands are separated, and the specific element contained in the first layer are bonded to each other.

16. The method of claim 13, wherein in supplying the reactive gas, the first layer and the reactive gas are reacted with each other, so that at least a part of atoms of the halogen element contained in the first layer is extracted from the first layer, and at least a part of a ligand or ligands contained in the reactive gas is separated from the reactive gas, and nitrogen of the reactive gas from which at least the part of the ligand or ligands are separated, and the specific element contained in the first layer are bonded to each other, and further carbon contained in the ligand and the specific element contained in the first layer are bonded to each other.

17. A method of processing a substrate, comprising:
   forming a film containing a specific element, nitrogen, and carbon, on a substrate by alternately performing the following steps a specific number of times:
   supplying a source gas containing the specific element and a halogen element to the substrate in a processing chamber; and
   supplying a reactive gas composed of three elements of carbon, nitrogen, and hydrogen and having more number of a carbon atom than the number of a nitrogen atom in a composition formula thereof, to the substrate in the processing chamber,
   wherein a pressure in the processing chamber in supplying the reactive gas is set to be larger than a pressure in the processing chamber in supplying the source gas.

18. A substrate processing apparatus, comprising:
   a processing chamber in which a substrate is housed;
   a source gas supply system configured to supply a source gas containing a specific element and a halogen element into the processing chamber;
   a reactive gas supply system configured to supply a reactive gas composed of three elements of carbon, nitrogen, and hydrogen and having more number of a carbon atom than the number of a nitrogen atom in a composition formula thereof, into the processing chamber; and a control part configured to control the source gas supply system and the reactive gas supply system, so that a processing of forming a film containing the specific element, nitrogen, and carbon on the substrate, is performed by alternately performing a processing of supplying the source gas to the substrate in the processing chamber, and a processing of supplying the reactive gas to the substrate in the processing chamber, a specific number of times, and a pressure in the processing chamber in a process of supplying the reactive gas is set to be larger than a pressure in the processing chamber in a process of supping the source gas.

19. A non-transitory computer-readable recording medium storing a program that causes a computer to perform a procedure of forming a film containing a specific element, nitrogen, and carbon on a substrate in a processing chamber of a substrate processing apparatus, by alternately performing the following procedures a specific number of times:

a procedure of supplying a source gas containing the specific element and a halogen element, to the substrate in the processing chamber; and a procedure of supplying a reactive gas composed of three elements of carbon, nitrogen and hydrogen and having more number of a carbon atom than the number of a nitrogen atom in a composition formula thereof, to the substrate in the processing chamber, wherein a pressure in the processing chamber in the procedure of supplying reactive gas is set to be larger than a pressure in the processing chamber in the procedure of supplying the source gas.

20. The method of manufacturing a semiconductor device according to claim 1, wherein the pressure in the processing chamber in supplying the reactive gas is set in a range of 399 to 3990 Pa.

21. The method of manufacturing a semiconductor device according to claim 1, wherein in supplying the reactive gas, the reactive gas is thermally activated and is supplied to the substrate.

22. The method of manufacturing a semiconductor device of claim 1, wherein in supplying the reactive gas, the reactive gas is thermally activated by non-plasma and is supplied to the substrate.

* * * * *

UNITED STATES PATENT AND TRADEMARK OFFICE
CERTIFICATE OF CORRECTION

| | | |
|---|---|---|
| PATENT NO. | : 8,815,751 B2 | Page 1 of 1 |
| APPLICATION NO. | : 13/708348 | |
| DATED | : August 26, 2014 | |
| INVENTOR(S) | : Yoshiro Hirose et al. | |

It is certified that error appears in the above-identified patent and that said Letters Patent is hereby corrected as shown below:

On the Title Page:

In the Applicants line; the Second Applicant (71); delete "L'Air Liquide-Societe Anonyme pour l'Etude et l'Exploitation des Procedes George" and insert -- L'Air Liquide-Societe Anonyme pour l'Etude et l'Exploitation des Procedes Georges Claude --, therefore.

Signed and Sealed this
Twenty-third Day of December, 2014

Michelle K. Lee
*Deputy Director of the United States Patent and Trademark Office*